United States Patent
Yamamoto et al.

(10) Patent No.: US 7,855,384 B2
(45) Date of Patent: Dec. 21, 2010

(54) SIC SEMICONDUCTOR DEVICE AND METHOD FOR MANUFACTURING THE SAME

(75) Inventors: Tsuyoshi Yamamoto, Kariya (JP); Toshio Sakakibara, Nishio (JP); Hiroki Nakamura, Handa (JP); Toshiyuki Morishita, Nagoya (JP); Takasumi Ooyanagi, Hitachinaka (JP); Atsuo Watanabe, Hitachiota (JP)

(73) Assignees: DENSO CORPORATION, Kariya (JP); Hitachi Ltd., Tokyo (JP)

( * ) Notice: Subject to any disclaimer, the term of this patent is extended or adjusted under 35 U.S.C. 154(b) by 718 days.

(21) Appl. No.: 11/783,611

(22) Filed: Apr. 10, 2007

(65) Prior Publication Data

US 2007/0241338 A1 Oct. 18, 2007

(30) Foreign Application Priority Data

Apr. 11, 2006 (JP) .............................. 2006-108699

(51) Int. Cl.
*H01L 29/04* (2006.01)
*H01L 29/94* (2006.01)

(52) U.S. Cl. .............................. 257/77; 257/55; 257/65; 257/76; 257/183; 257/197; 257/328; 257/329

(58) Field of Classification Search .................... 257/55, 257/65, 76, 77, 183, 197, 328, 329
See application file for complete search history.

(56) References Cited

U.S. PATENT DOCUMENTS 6,117,735 A 9/2000 Ueno 7,282,739 B2 * 10/2007 Kaneko ........................ 257/77
2005/0258454 A1 11/2005 Kumar et al.
2006/0060884 A1 3/2006 Ohyanagi et al.
2006/0071217 A1 4/2006 Ohyanagi et al.

FOREIGN PATENT DOCUMENTS

JP A-2005-108926 4/2005

OTHER PUBLICATIONS

Zhao, Jr., et al., "3.6 m$\Omega$cm$^2$, 1726V 4H-SiC Normally-off Trenched-and-Implanted Vertical JFETs," Power Semiconductor Device and ICs 2003, *ISPSD 2003 IEEE 15$^{th}$ International Symposium*, IEEE, Apr. 14-17, 2003, pp. 50-53, (Discussed on pp. 1-2 and 15 of the specification).
Office Action dated Feb. 3, 2009 in corresponding German patent application No. 10 2007 017 002.7-33 (and English translation).

* cited by examiner

*Primary Examiner*—Kenneth A Parker
*Assistant Examiner*—Joseph Nguyen
(74) *Attorney, Agent, or Firm*—Posz Law Group, PLC

(57) ABSTRACT

A SiC semiconductor device includes: a SiC substrate having a drain layer, a drift layer and a source layer stacked in this order; multiple trenches penetrating the source layer and reaching the drift layer; a gate layer on a sidewall of each trench; an insulation film on the sidewall of each trench covering the gate layer; a source electrode on the source layer; and a diode portion in or under the trench contacting the drift layer to provide a diode. The drift layer between the gate layer on the sidewalls of adjacent two trenches provides a channel region. The diode portion is coupled with the source electrode, and insulated from the gate layer with the insulation film.

14 Claims, 34 Drawing Sheets

US 7,855,384 B2

SIC SEMICONDUCTOR DEVICE AND METHOD FOR MANUFACTURING THE SAME

CROSS REFERENCE TO RELATED APPLICATION

This application is based on Japanese Patent Application No. 2006-108699 filed on Apr. 11, 2006, the disclosure of which is incorporated herein by reference.

FIELD OF THE INVENTION

The present invention relates to a SiC semiconductor device and a method for manufacturing a SiC semiconductor device.

BACKGROUND OF THE INVENTION

FIG. 21 shows a sectional view of a silicon carbide semiconductor device including a J-FET (junction type field-effect transistor) according to a prior art. The silicon carbide semiconductor device shown in FIG. 21 has a trench structure. Concretely, the semiconductor device includes an $N^+$ layer J1 which is a drain region, an $N^-$-type drift layer J2 which overlies the $N^+$-type layer J1, an $N^+$-type source layer J3 which overlies the $N^-$-type drift layer J2, a $P^+$-type layer J5 which is formed along the bottom surface of a trench J4 that is deep enough to penetrate through the $N^+$-type source layer J3 and to arrive at the $N^-$-type drift layer J2, a $P^+$-type gate layer J6 which is formed along the side surface of the trench J4 and which communicates with the $P^+$-type layer J5, an insulator film J7 which is formed on the side surface of the trench J4, a gate wiring line J8 which is electrically connected with the $P^+$-type gate layer J6 through the $P^+$-type layer J5, a silicon oxide film J9 which is formed within the trench J4, a source electrode J10 which is electrically connected with the source layer J3, and a drain electrode J11 which is electrically connected with the $N^+$ layer J1 (refer to, for example, Non-patent Document 1; Zhao, J. H. et al: 3.6 m$\Omega$cm$^{-2}$, 1726V 4H-SiC Normally-off Trenched-and-Implanted Vertical JFETs, "Power Semiconductor Device and ICs, 2003, Proceedings, ISPSD' 03. 2003 IEEE 15th International Symposium", IEEE, 14-17 Apr. 2003, p. 50-53). Incidentally, a region J12 enclosed with a broken line is a region which chiefly functions as the J-FET.

With the silicon carbide semiconductor device, owing to the adoption of the trench structure, the integration degree of the J-FETs is easily raised by minimizing a cell size, and the ON-resistance of the semiconductor device can be lowered in accordance with the integration degree.

Besides, a silicon carbide semiconductor device of another structure is such that a MOSFET is included instead of the J-FET, and that a diode region formed with a diode is added between cell regions in each of which the transistor is configured (refer to, for example, JP-A-2005-108926). With the silicon carbide semiconductor device, the region which is not inherently formed in the cell region is added.

In the former of the silicon carbide semiconductor devices mentioned above, the $P^+$-type layer J5 and the $P^+$-type gate layer J6 are electrically connected with a gate electrode, and a P-type region connected to the source electrode as is included in a general MOSFET is not disposed, so that a diode connected to the source electrode is not built in structurally.

In order to perform an inverter operation with the silicon carbide semiconductor device, therefore, a chip formed with a diode for causing a back current, namely, a current reverse in sense to that of the J-FET to flow needs to be externally assembled to a chip formed with the J-FETs, or a diode region formed with a diode needs to be disposed in the same chip as the chip formed with the J-FETs.

In the case of the external assemblage, however, the two chips are connected by a wiring line, to incur the problems that a switching loss ascribable to the inductance of the wiring line occurs, and that a surge voltage increases. Therefore, it is better to build the diode in the silicon carbide semiconductor device of the above structure, than to externally mount the diode on the semiconductor device.

In this regard, when a method for forming the built-in diode is studied, the structure in which the diode region is added separately from the cell regions, in the same chip, is concretely considered as in JP-A-2005-108926.

From the viewpoints of facilitating the design of the layout of the chip and making the size of the chip smaller, however, a structure in which a diode region is formed by effectively utilizing part of the cell region is more favorable than the structure in which the diode region is added separately from the cell regions, within the chip.

Thus, it is required for a silicon carbide semiconductor device including a J-FET of trench structure, in which a diode is built in part of a cell region formed with the J-FET.

SUMMARY OF THE INVENTION

In view of the above-described problem, it is an object of the present disclosure to provide a SiC semiconductor device. It is another object of the present disclosure to provide a method for manufacturing a SiC semiconductor device.

According to a first aspect of the present disclosure, a SiC semiconductor device includes: a SiC substrate including a drain layer having a first conductive type, a drift layer having the first conductive type and a source layer having the first conductive type, wherein the drain layer, the drift layer and the source layer are stacked in this order; a plurality of trenches, each of which penetrates the source layer and reaches the drift layer; a gate layer having a second conductive type and disposed on a sidewall of each trench, wherein a part of the drift layer sandwiched between the gate layer on the sidewalls of adjacent two trenches provides a channel region; an insulation film disposed on the sidewall of each trench for covering the gate layer; a source electrode disposed on the source layer; and a diode portion disposed in each trench and/or under each trench and contacting the drift layer to provide a diode. The diode portion is electrically coupled with the source electrode, and electrically insulated from the gate layer with the insulation film on the sidewall of each trench.

In the above device, a diode is formed in a transistor forming region.

According to a second aspect of the present disclosure, a method for manufacturing a SiC semiconductor device includes: preparing a SiC substrate, which includes a drain layer having a first conductive type, a drift layer having the first conductive type and a source layer having the first conductive type, wherein the drain layer, the drift layer and the source layer are stacked in this order; forming a plurality of trenches, each of which penetrates the source layer and reaches the drift layer; forming a gate layer having a second conductive type and disposed on a sidewall of each trench, wherein a part of the drift layer sandwiched between the gate layer on the sidewalls of adjacent two trenches provides a channel region, and wherein the drift layer is exposed on a bottom of each trench; forming a source electrode on the source layer; forming an insulation film on the sidewall of each trench for covering the gate layer; and forming a Schottky electrode in each trench or under each trench. The Schottky electrode is electrically coupled with the source electrode, and electrically insulated from the gate layer with the insulation film on the sidewall of each trench, and the Schottky electrode and the drift layer provide a Schottky junction to form a Schottky diode.

In the above method, a diode is formed in a transistor forming region. Further, the insulation film on the sidewall of the trench becomes homogeneous. Thus, the Schottky electrode is formed with a self-alignment manner with respect to the sidewall of the trench. Thus, the distance between the Schottky electrode and the sidewall of the trench is homogeneous.

According to a third aspect of the present disclosure, a method for manufacturing a SiC semiconductor device includes: preparing a SiC substrate, which includes a drain layer having a first conductive type, a drift layer having the first conductive type and a source layer having the first conductive type, wherein the drain layer, the drift layer and the source layer are stacked in this order; forming a plurality of trenches, each of which penetrates the source layer and reaches the drift layer; forming a gate layer having a second conductive type and disposed on a sidewall of each trench, wherein a part of the drift layer sandwiched between the gate layer on the sidewalls of adjacent two trenches provides a channel region, and wherein the drift layer is exposed on a bottom of the trench; forming a second conductive type semiconductor layer just under the bottom of the trench by implanting an ion on the bottom of the trench after the forming the gate layer, wherein the second conductive type semiconductor layer is separated from the gate layer, and wherein the second conductive type semiconductor layer and the drift layer provide a PN junction; forming an insulation film disposed on the sidewall of each trench for covering the gate layer after the forming the second conductive type semiconductor layer; forming a source electrode disposed on the source layer after the forming the insulation film; and forming a source wiring electrode in the trench after the forming the source electrode, wherein the source electrode is electrically coupled with the second conductive type semiconductor layer through the source wiring electrode.

In the above method, a diode is formed in a transistor forming region.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

First Example

Figure 1:
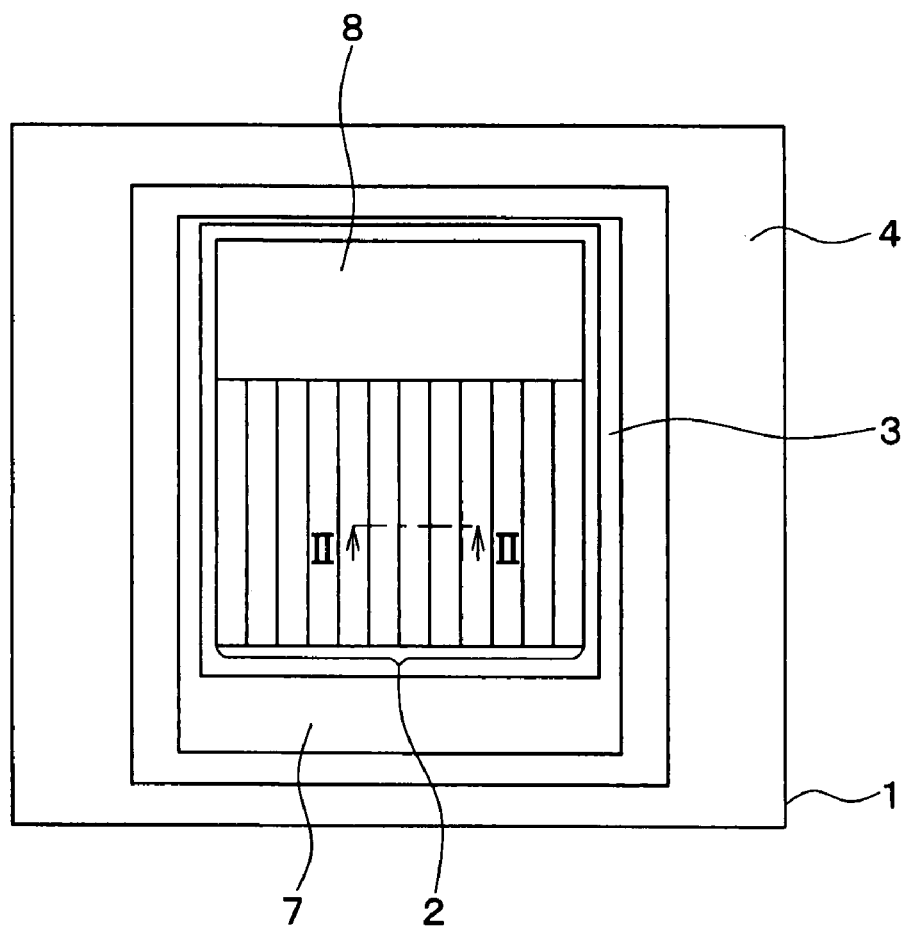
FIG. 1 is a plan view showing a SiC semiconductor device according to a first embodiment.
Figure 2:
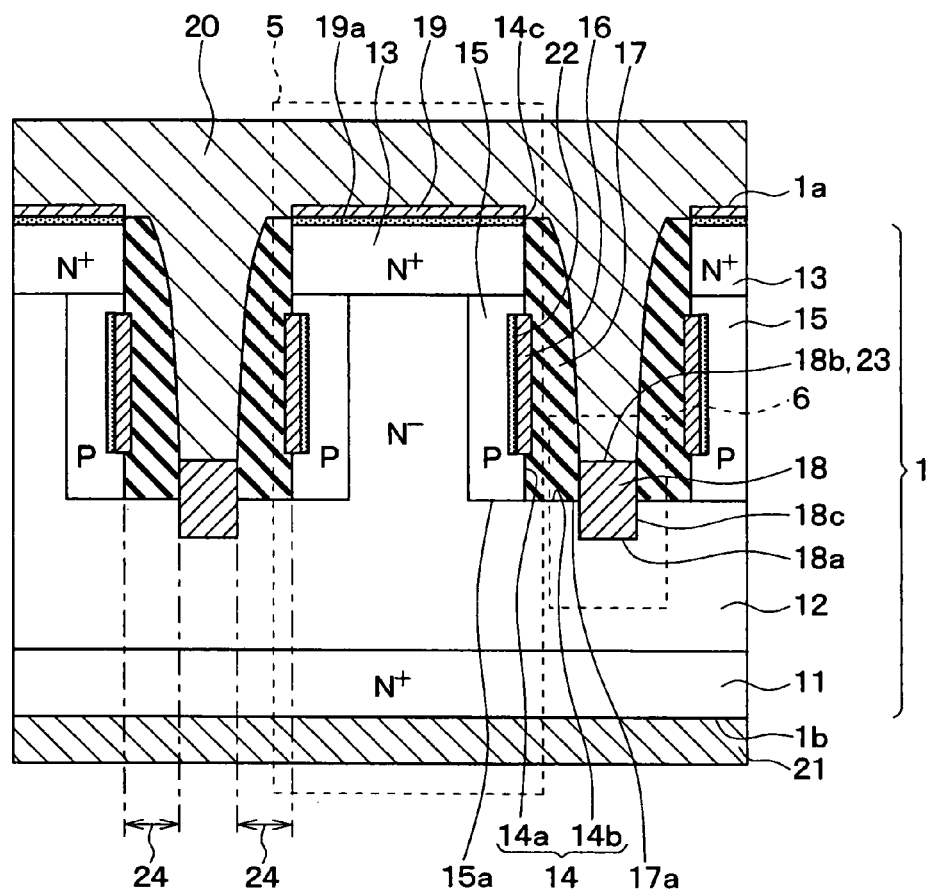
FIG. 2 is a cross sectional view showing the device taken along line II-II in FIG. 1.

FIG. 1 shows a plan view of a semiconductor device in the first embodiment, while FIG. 2 shows a sectional view of the semiconductor device seen in the direction of arrows II-II indicated in FIG. 1, as the first example of this embodiment. FIG. 2 is the sectional view in the case where the semiconductor device is cut in a direction perpendicular to the lengthwise direction of trenches arranged extending in one direction. Incidentally, an upper and lower direction in FIG. 2 is the thickness direction of a semiconductor substrate 1, that is, a direction perpendicular to the surfaces of the semiconductor substrate 1. A left and right direction in FIG. 2 is a direction parallel to the surfaces of the semiconductor substrate 1, and an upper side in FIG. 2 is the side of the front surface 1a of the semiconductor substrate 1, while a lower side in FIG. 2 is the side of the back surface 1b of the semiconductor substrate 1.

As shown in FIG. 1, the semiconductor device of this embodiment includes a cell region 2 which is formed in the semiconductor substrate 1, a gate region 3 which is located in a place different from the place of the cell region 2, and an outer peripheral region 4 which is located outside the regions 2 and 3.

Besides, as shown in FIG. 2, the cell region 2 is formed with a trench type J-FET 5 of vertical type wherein a current is caused to flow in a vertical direction, and a diode 6 for causing a back current to flow. In this embodiment, the diode 6 is a Schottky diode which is made of SiC (silicon carbide) and a metal. The Schottky diode 6 is employed as a diode for a low withstand voltage of, for example, 1.2 kV, and it is willingly used from the viewpoint of an ON-voltage.

Concretely, the semiconductor device includes in the cell region 2, an $N^+$-type layer 11 which is a drain layer, an $N^-$-type drift layer 12 which overlies the $N^+$-type layer 11, an $N^+$-type source layer 13 which overlies the $N^-$-type drift layer 12, a P-type gate layer 15 which is formed along the side surface 14a of a trench 14 that is deep enough to penetrate through the $N^+$-type source layer 13 from the front surface 1a of the semiconductor substrate 1 constituted by the $N^+$-type layer 11, $N^-$-type drift layer 12 and $N^+$-type source layer 13 and to arrive at the $N^-$-type drift layer 12, a gate wiring electrode 16 which is formed on the side surface 14a of the trench 14 and which is electrically connected with the P-type gate layer 15, an interlayer insulator film 17 which is formed within the trench 14 and which covers the side surface 14a of the trench 14, a Schottky electrode 18 which defines a Schottky junction with the $N^-$-type drift layer 12, a source electrode 19 which is formed on the front surface of the $N^+$-type source layer 13 and which is electrically connected with this $N^+$-type source layer 13, a source wiring electrode 20 which is electrically connected with the source electrode 19 and Schottky electrode 18, and a drain electrode 21 which is formed on the back surface 1b of the semiconductor substrate 1 and which is electrically connected with the $N^+$ layer 11.

The $N^+$ layer 11, $N^-$-type drift layer 12, $N^+$-type source layer 13 and P-type gate layer 15 are formed of a semiconductor made of silicon carbide (SiC).

In the first example shown in FIG. 2, the P-type gate layer 15 and the gate wiring electrode 16 are formed on only the side surface 14a in the side surface 14a and bottom surface 14b of the trench 14.

The P-type gate layer 15 is located on the side of the $N^-$-type drift layer 12 with respect to the side surface 14a of the trench 14, and on a side lower than the $N^+$-type source layer 13. Thus, between the adjacent trenches 14, that part of the N-type drift layer 12 which is located on the lower side of the $N^+$-type source layer 13 is held between the P-type gate layers 15 from both left and right sides in the figure. Besides, the lower end part 15a of the P-type gate layer 15 and the bottom surface 14b of the trench 14 assume the same position in the thickness direction of the semiconductor substrate 1.

The gate wiring electrode 16 is made of a metal, for example, Ni (nickel), and a contact layer 22 made of a silicide, for example, $NiSi_2$ (nickel disilicide) is formed between the gate wiring electrode 16 and the P-type gate layer 15. The contact layer 22 may provide the connection portion between a gate layer and a gate wiring electrode.

Besides, the lower ends of the contact layer 22 and gate wiring electrode 16 are spaced from the bottom surface 14b of the trench 14, and the upper ends thereof are spaced from the $N^+$-type source layer 13. More specifically, the contact layer 22 and gate wiring electrode 16 are located inside the outer peripheral end of the P-type gate layer 15 in the surfaces of this P-type gate layer 15 and do not extend beyond the surfaces of the P-type gate layer 15, so that they touch (short-circuit) with neither of the $N^-$-type drift layer 12 and the $N^+$-type source layer 13. In this way, it is avoidable that the contact layer 22 and the gate wiring electrode 16 extend beyond the surfaces of the P-type gate layer 15, to come into touch with the $N^-$-type drift layer 12 and the $N^+$-type source layer 13, so the withstand voltages of a gate—source junction and a gate—drain junction lower.

Here, as shown in FIG. 1, a gate electrode pad 7 is formed on the substrate surface, in the gate region 3 located outside the cell region 2. Although no illustration is made, the gate wiring electrode 16 stretches to the gate region 3 and is connected with the gate electrode pad 7 in FIG. 1.

The interlayer insulator film 17 is formed of, for example, a silicon oxide film, and it electrically insulates the P-type gate layer 15 and the gate wiring electrode 16 from the source wiring electrode 20 and the Schottky electrode 18, within the trench 14. The interlayer insulator film 17 is located from the bottom surface 14b of the trench 14 to the upper corner part 14c thereof. Besides, the interlayer insulator films 17 opposing within the trench 14 have the same thickness in the lateral direction in FIG. 2. However, the thickness of the interlayer insulator film 17 in the lateral direction in the figure decreases gradually from the trench bottom surface 14b upwards in the figure.

Since the interlayer insulator films 17 opposing within the trench 14 have the same thickness in the lateral direction in the figure, distances 24 from the Schottky electrode 18 to the trench side surfaces 14a, P-type gate regions 15 and gate wiring electrodes 16 which are located on both the lateral sides of this Schottky electrode 18 are uniform.

In a case where, unlike in FIG. 2, the distances 24 from the Schottky electrode 18 to the P-type gate regions 15 located on both the lateral sides thereof are not uniform, a smaller interval must be set at a magnitude necessary for ensuring a withstand voltage, and hence, a larger interval becomes an unnecessarily large magnitude.

In contrast, according to this embodiment, one of the intervals between the Schottky electrode 18 and the P-type gate regions 15 located on both the lateral sides thereof in FIG. 2 does not become unnecessarily large. Therefore, the width of the trench 14 can be made smaller than in the case stated above, and the size of a unit cell can be made smaller.

The Schottky electrode 18 is made of a metal for forming a Schottky junction with a semiconductor layer of, for example, Ti (titanium). The Schottky diode 6 is constituted by the Schottky electrode 18 and the $N^-$-type drift layer 12. The Schottky electrode 18 may provide a diode constituting portion.

Figure 3:
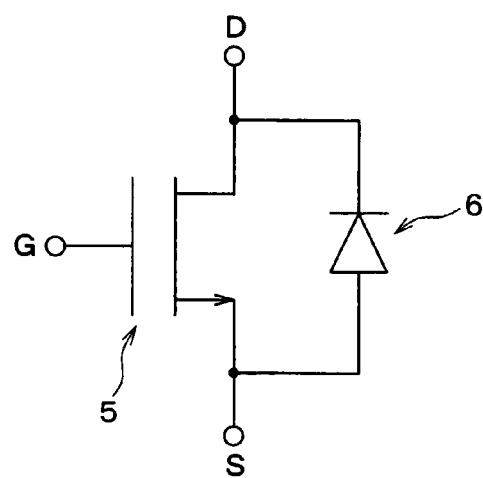
FIG. 3 is a circuit diagram showing a diode and a J-FET in the device in FIG. 1.

Here, FIG. 3 shows a circuit diagram of the Schottky diode 6 and the J-FET 5. As shown in FIG. 3, the Schottky diode 6 is connected between the drain and source of the J-FET 5 so that its current may flow in a sense reverse to the sense of the current of the J-FET 5.

Concretely, as shown in FIG. 2, the Schottky electrode 18 is held between the interlayer insulator films 17 formed on the confronted side surfaces 14a of the trenches 14, within these trenches 14, and it is located at the bottom parts of the trenches 14.

Besides, the Schottky electrode 18 protrudes below the trench bottom part 14b, and the lower end part 18a of the Schottky electrode 18 is located below the lower end part 17a of the interlayer insulator film 17. Therefore, the lower end surface 18a of the Schottky electrode 18 and part of the side surface 18c thereof as are located below the trench bottom surface 14b are junctioned with the $N^-$-type drift layer 12. Besides, the lower end part 18a of the Schottky electrode 18 is located below the lower end part 15a of the P-type gate layer 15.

Besides, the upper end part 18b of the Schottky electrode 18 is located above the trench bottom surface 14b. That is, the connection part 23 between the Schottky electrode 18 and the source wiring electrode 20 is located above the trench bottom surface 14b.

Besides, the widths of the Schottky electrodes 18 (the lengths thereof in the same direction as that of trench widths) are uniform, and the width of the connection part 23 between the Schottky electrode 18 and the source wiring electrode 20 is the same as the width of the lower end part 18a of the Schottky electrode 18.

The source electrode 19 is made of a metal, for example, Ni (nickel), and a contact layer 19a made of a silicide, for example, $NiSi_2$ (nickel disilicide) is formed between the source electrode 19 and the $N^+$-type source layer 13.

The source wiring electrode 20 is a wiring line for connecting a source electrode pad 8 in FIG. 1 and the source electrode 19, and it is made of a wiring material such as Al (aluminum). As shown in FIG. 2, the source wiring electrode 20 is formed extending from the front surface of the source electrode 19 to the inner part of the trench 14, and the source electrode 19 and the Schottky diode 6 are connected by the source wiring electrode 20.

Alternatively, unlike in FIG. 2, the source wiring electrode 20 is not formed within the trench 14, but an interlayer insulator film is buried within the trench 14 so as to insulate the source wiring electrode 20 and the Schottky electrode 18, and the Schottky electrode 18 is stretched into a region different from the cell region 2, whereby the Schottky electrode 18 can be connected with the source wiring electrode 20 in the different region. That is, the contact of the Schottky electrode 18 can also be formed in the region different from the cell region 2.

However, in a case where the Schottky electrode 18 is made of a metal material having an electric resistance higher than that of the source wiring electrode 20, the wiring resistance of the Schottky diode 6 increases.

In contrast, in this embodiment, the connection part 23 between the source wiring electrode 20 and the Schottky electrode 18 is formed within the trench 14, and hence, the wiring resistance of the Schottky diode 6 can be made lower than in the case of forming the connection part outside the cell region 2.

Besides, the width of the source wiring electrode 20 in the lateral direction in FIG. 2 enlarges gradually upwards in the figure, from the side of the front surface 1a of the semiconductor substrate 1, that is, from the side of the trench bottom surface 14b. Thus, the resistance of the source wiring electrode 20 can be made lower than in a case where, unlike in FIG. 2, the width of the source wiring electrode 20 is uniform and is the same as the width of the connection part 23 between the Schottky electrode 18 and the source wiring electrode 20.

The silicon carbide semiconductor device of this embodiment thus configured is operated in, for example, a normally-OFF mode as described below. In the $N^-$-type drift layer 12, the part which is located between the adjacent P-type gate layers 15 and which is located under the $N^+$-type source layer 13 acts as a channel region. Besides, in a case where any voltage is not applied to the adjacent P-type gate layers 15, the channel region is pinched off by depletion layers which extend from both the adjacent P-type gate layers 15. Thus, any current does not flow between the source and drain of the J-FET 5. On the other hand, in a case where a voltage is applied to the adjacent P-type gate layers 15, the extension magnitudes of the depletion layers extending in the channel region are reduced, whereby a current flows between the source and the drain.

Figure 4A:
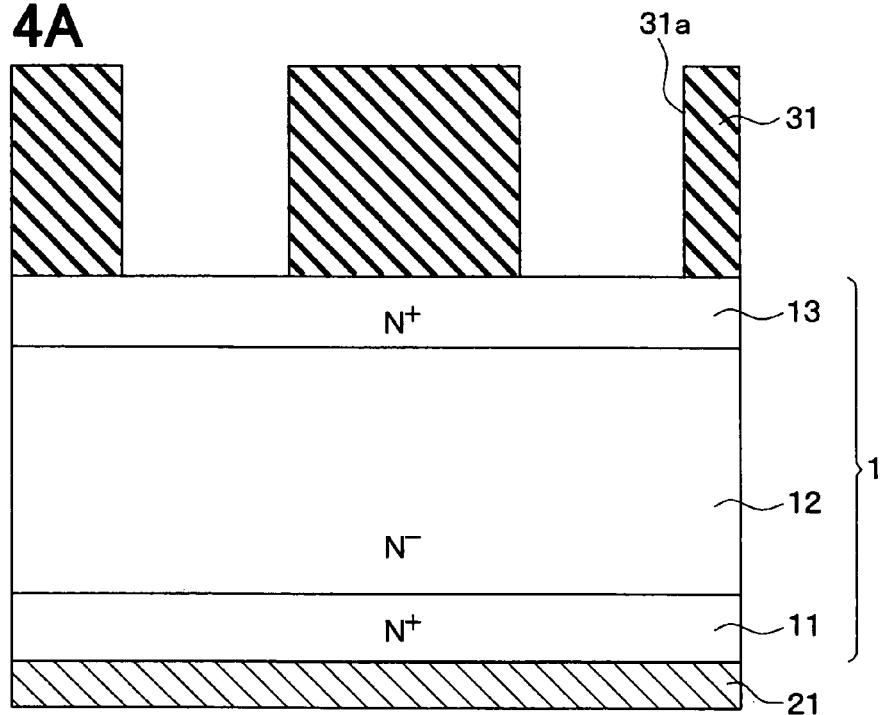
FIGS. 4A to 4U are cross sectional views explaining a method for manufacturing the device in FIG. 2.

Next, a method for manufacturing the semiconductor device of the above structure will be described. FIGS. 4A to 4U show a manufacturing process for the semiconductor device.

First, as shown in FIG. 4A, a semiconductor substrate 1 which is constituted by an $N^+$ layer 11, an $N^-$-type drift layer 12 and an $N^+$-type source layer 13 and which is formed with a drain electrode 21 on its back surface 1b is prepared.

Besides, after an oxide film 31 of TEOS (tetraethoxysilane) is formed on the front surface 1a of the semiconductor substrate 1, openings 31a are formed in those parts of the oxide film 31 which oppose to regions scheduled to form trenches.

Figure 4B:
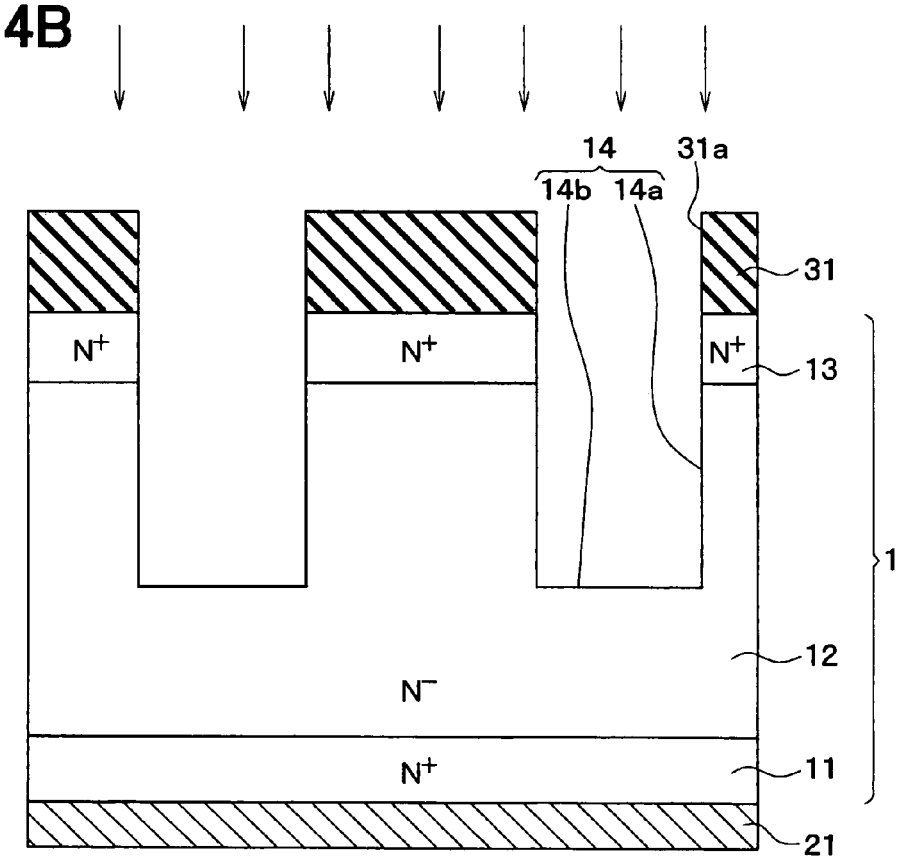

Subsequently, as shown in FIG. 4B, the first trenches 14 which are deep enough to penetrate through the $N^+$-type source layer 13 from the front surface 1a of the semiconductor substrate 1 and to arrive at the $N^-$-type drift layer 12 is formed by dry etching in which the oxide film 31 formed with the openings 31a is used as a mask.

Figure 4C:
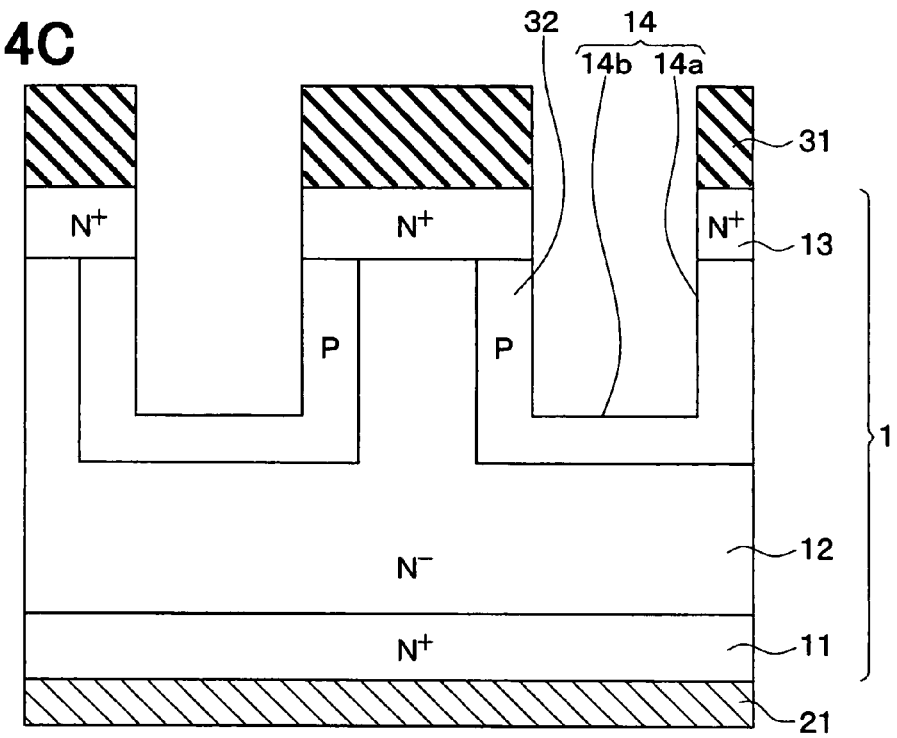

Subsequently, as shown in FIG. 4C, an oblique ion implantation employing, for example, Al (aluminum) as a P-type impurity is carried out for those parts of the $N^-$-type drift layer 12 which form the side surfaces 14a and bottom surfaces 14b of the trenches 14. Thus, P-type layers 32 which are located on the side of the $N^-$-type drift layer 12 with respect to the side surfaces 14a and bottom surfaces 14b of the trenches 14 and each of which is in a shape extending along the side surface 14a and bottom surface 14b of the trench 14 are formed.

Figure 4D:
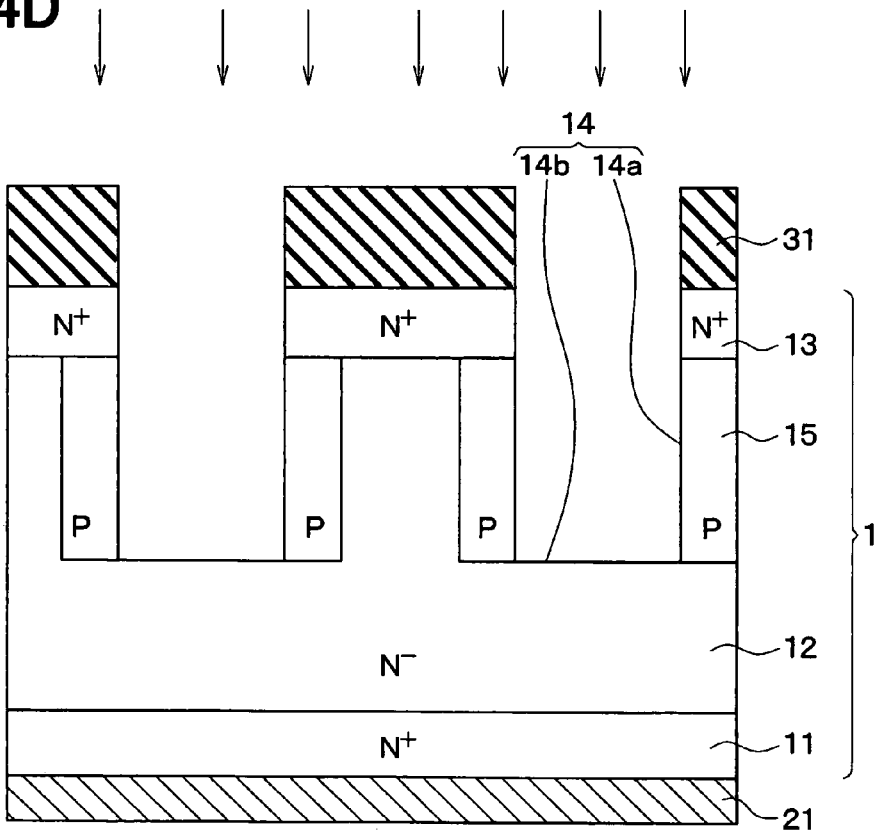

Subsequently, as shown in FIG. 4D, those parts of the P-type layers 32 which face to the trench bottom surfaces 14b are removed by dry etching, thereby to form P-type gate layers 15 which face only to the trench side surfaces 14a of the trenches 14. Besides, on this occasion, the first trenches 14 become deeper than in the case where they were formed by the step shown in FIG. 4A.

Incidentally, the P-type gate layers 15 which face only to the trench side surfaces 14a may well be formed by an oblique ion implantation in which the trench bottom surfaces 14b are covered with a mask material, without undergoing the steps shown in FIGS. 4C and 4D and after the step shown in FIG. 4B.

Figure 4E:
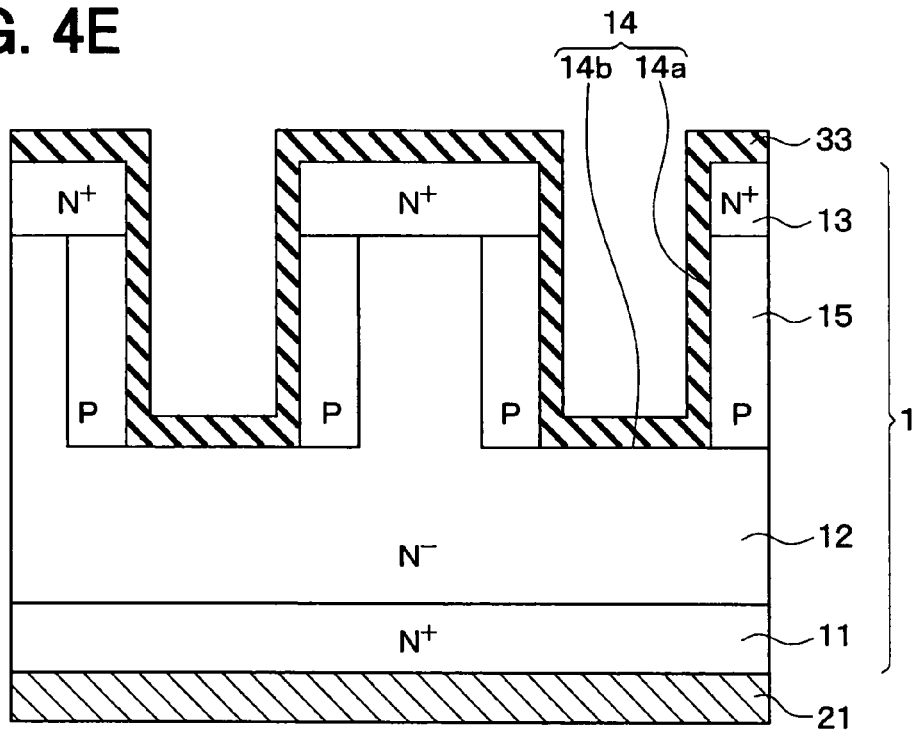

Subsequently, the oxide film 31 employed as the trench forming mask is removed. Thereafter, as shown in FIG. 4E, an oxide film 33 is formed on the front surface of the semiconductor substrate 1 including the wall surfaces 14a and 14b of the trenches 14. The oxide film 33 is utilized for the later formation of gate wiring electrodes 16.

Figure 4F:
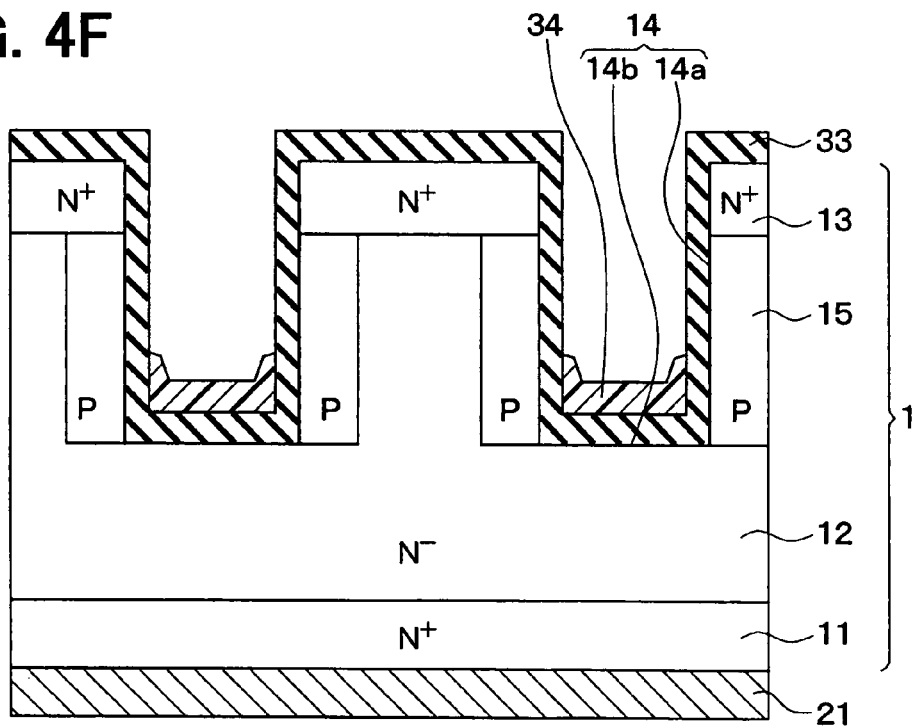

Subsequently, as shown in FIG. 4F, a resist film is formed on the front surface of the oxide film 33 and is thereafter etched back, thereby to leave a resist 34 on only the trench bottom surfaces 14b.

Figure 4G:
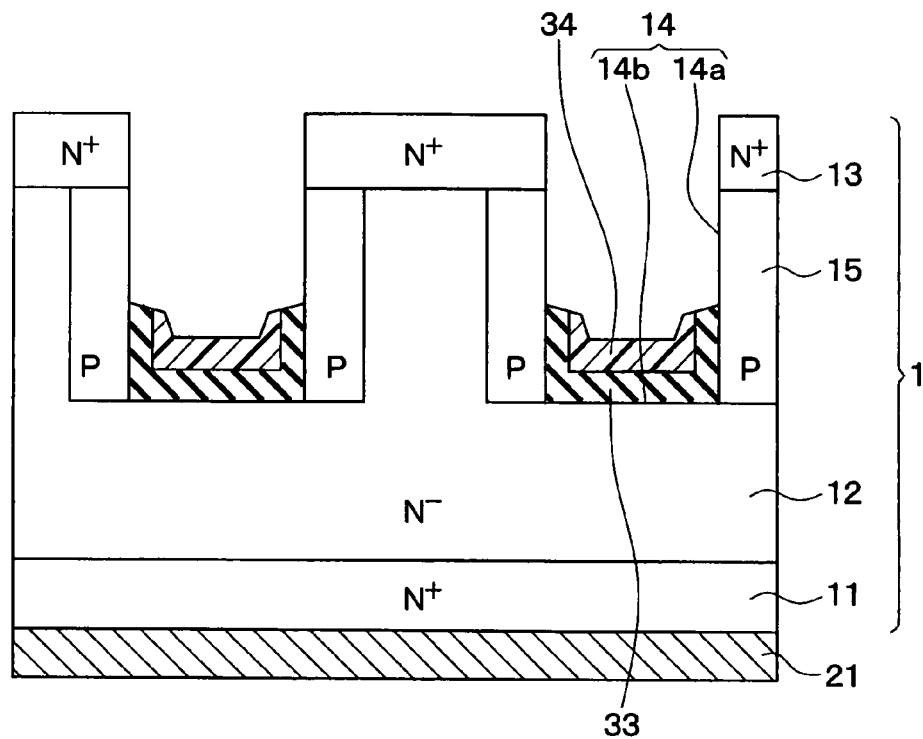

Subsequently, as shown in FIG. 4G, in the oxide film 33 formed on the wall surfaces of the trenches 14, parts which face to the bottom surface side parts of the trench bottom surfaces 14b and trench side surfaces 14a are left behind, and the other parts are removed, by etching which employs the resist 34 as a mask. Thereafter, the resist 34 is removed.

Figure 4H:
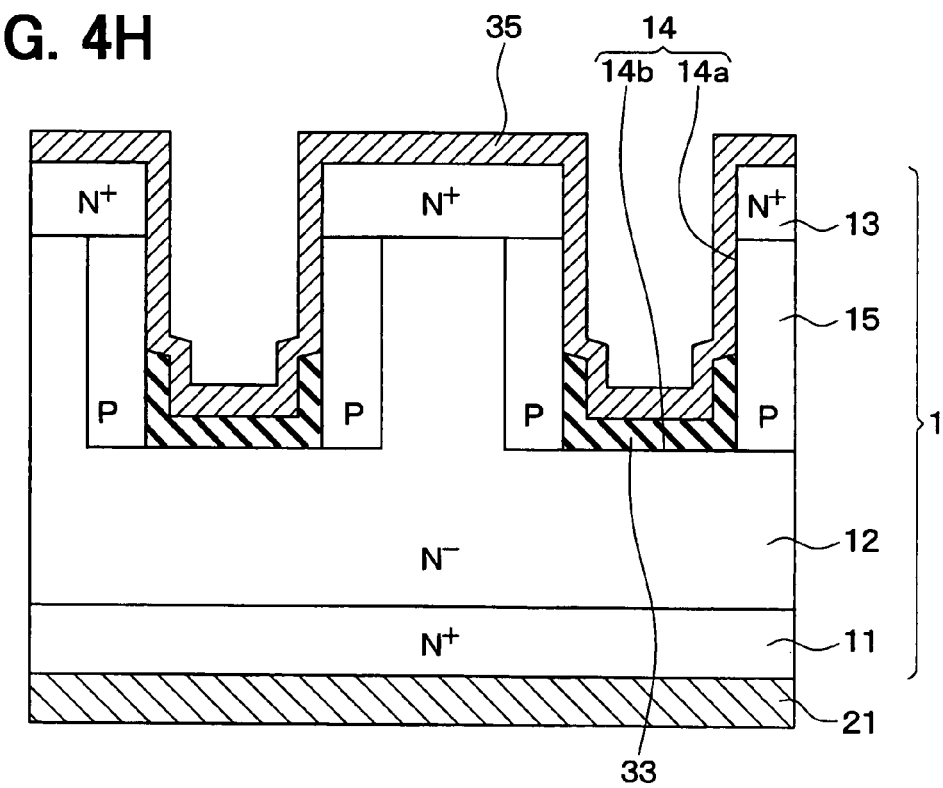

Subsequently, as shown in FIG. 4H, a metal film 35 for the gate wiring electrodes 16 is formed on the oxide films 33, the trench side walls 14a and the front surface of the semiconductor substrate 1.

Figure 4I:
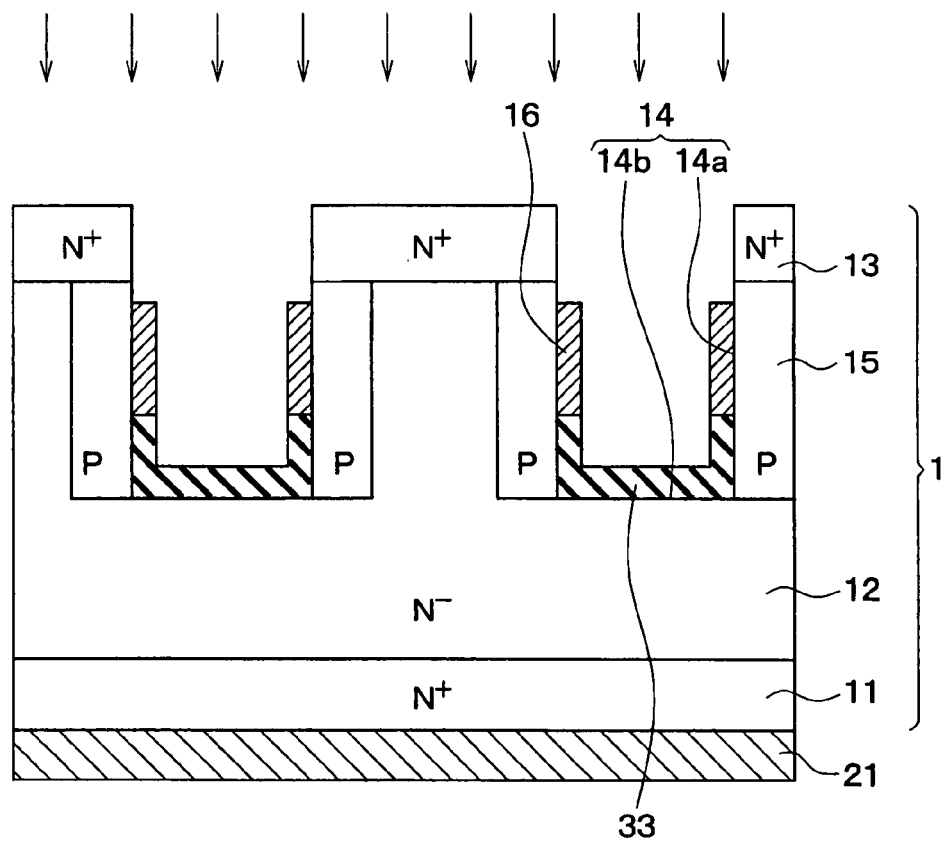

Subsequently, as shown in FIG. 4I, dry etching is performed so as to leave only those parts of the metal film 35 which lie in touch with the P-type gate layers 15, and to remove the other parts. Thus, the gate wiring electrodes 16 are formed. On this occasion, an etching quantity is adjusted so that the upper end of each gate wiring electrode 16 may be spaced from the corresponding N⁺-type source layer 13. Besides, since each gate wiring electrode 16 is formed on the corresponding oxide film 33, its lower end is spaced from the corresponding trench bottom surface 14b.

Figure 4J:
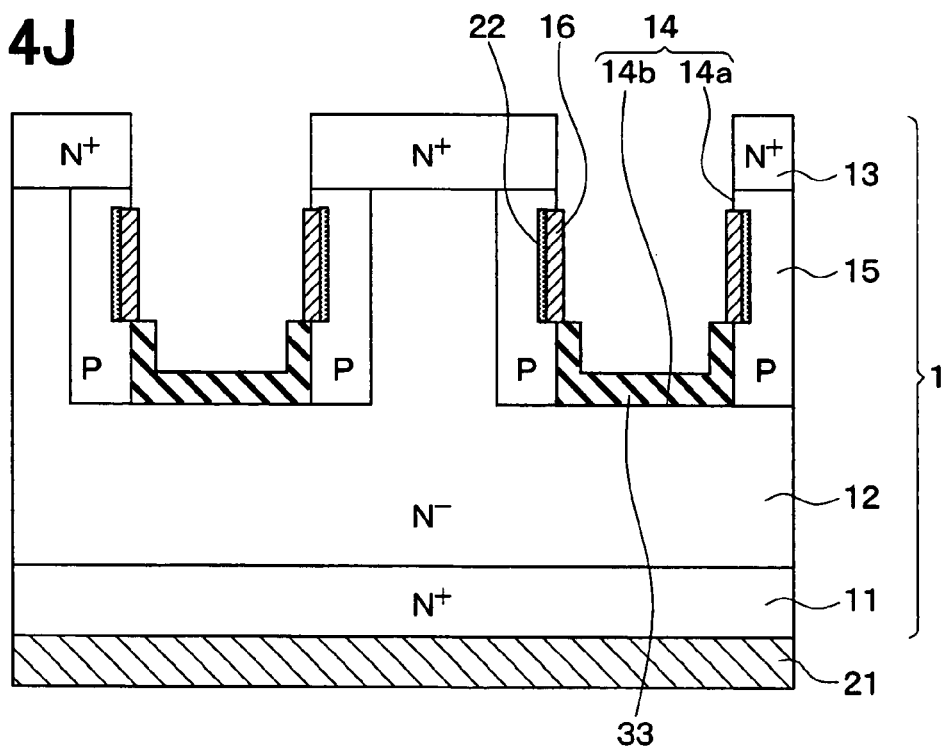

Subsequently, as shown in FIG. 4J, a silicide layer serving as a contact layer 22 is formed between each gate wiring electrode 16 and the corresponding P-type gate layer 15 by performing a heat treatment.

Figure 4K:
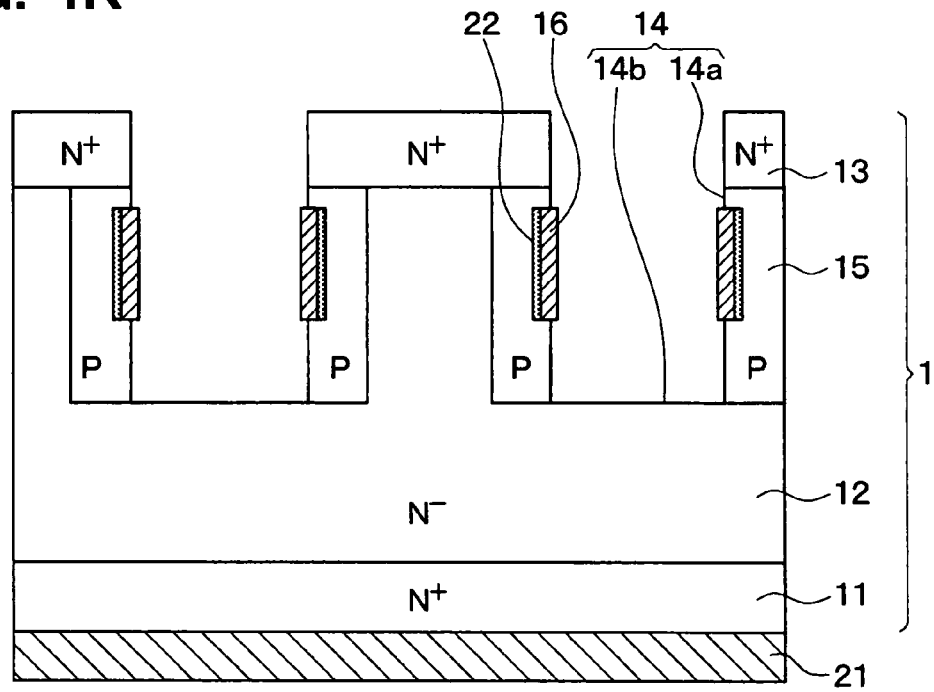

Subsequently, as shown in FIG. 4K, the oxide films 33 located on the trench bottom surfaces 14b are removed.

Figure 4L:
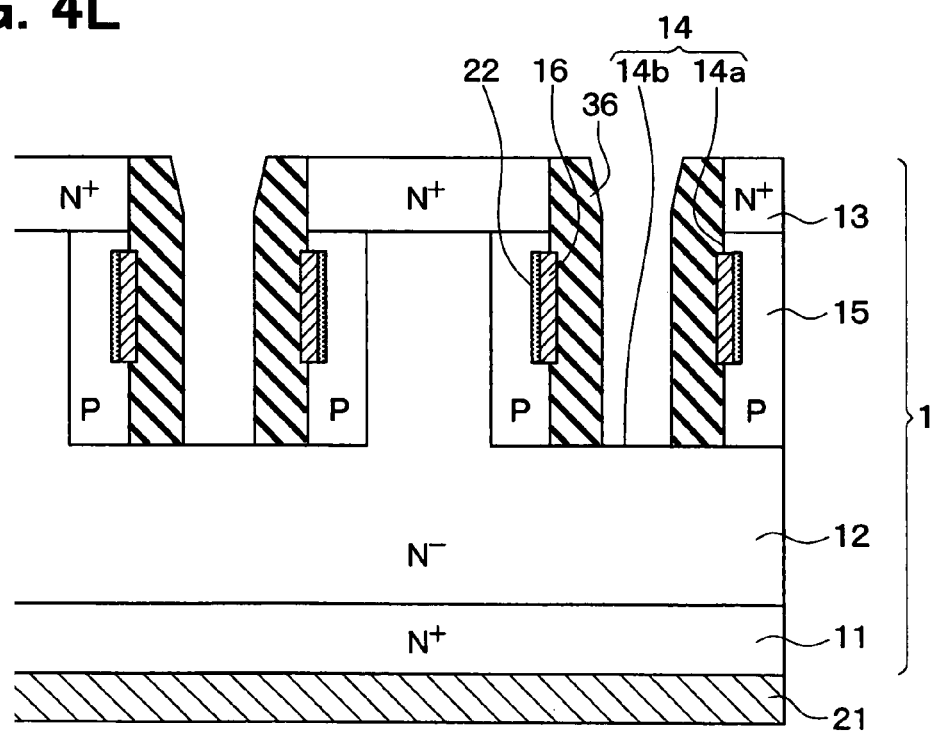

Subsequently, as shown in FIG. 4L, an oxide film is formed so as to extend from on the front surface of the semiconductor substrate 1 to on the trench wall surfaces 14a and 14b and is etched back, thereby to form oxide films 36 on only the trench side surfaces 14a among the front surface 1a of the semiconductor substrate 1 and the trench wall surfaces 14a and 14b. On this occasion, the front surface 1a of the semiconductor substrate 1 and the central parts of the trench bottom surfaces 14b are exposed.

Figure 4M:
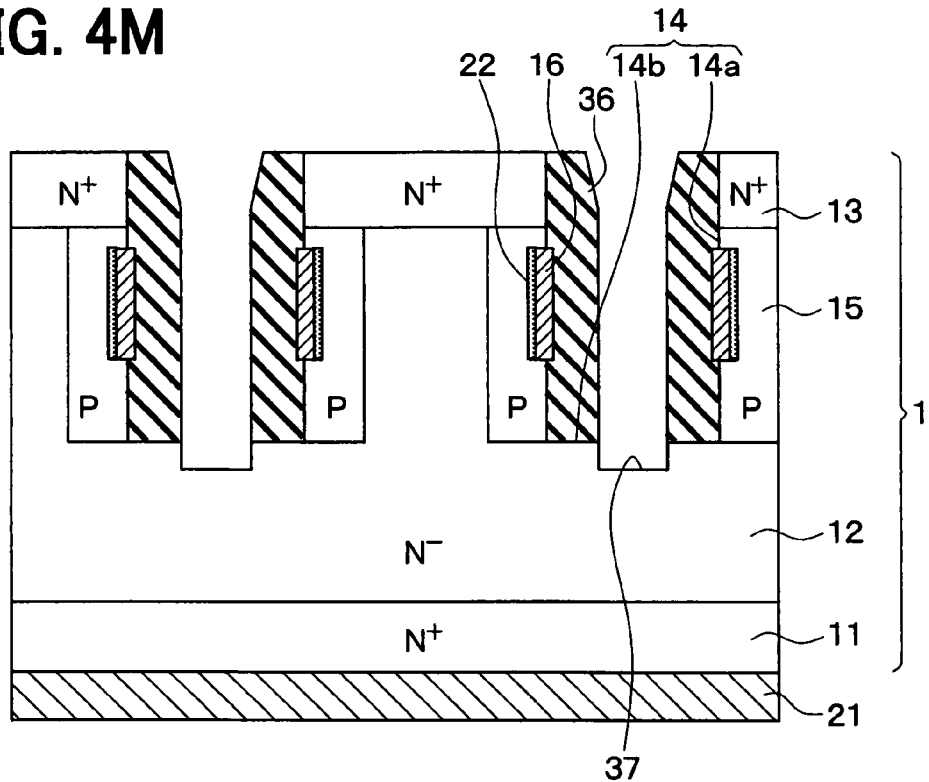

Subsequently, as shown in FIG. 4M, dry etching is performed for the exposed parts of the trench bottom surfaces 14b, whereby the second trenches 37 smaller in a trench width than the first trenches 14 are formed in the trench bottom surfaces 14b. In this case, $SF_6$ (sulfur hexafluoride), for example, can be employed as an etching gas. Incidentally, the depth of the second trenches 37 is set at will. Besides, on this occasion, the front surface side parts of the N⁺-type source layers 13 are simultaneously etched.

Thereafter, the oxide films 36 formed on the trench side surfaces 14a are removed. On this occasion, the contact layers 22 and gate wiring electrodes 16 which are located on the trench side surfaces 14a are left behind.

Figure 4N:
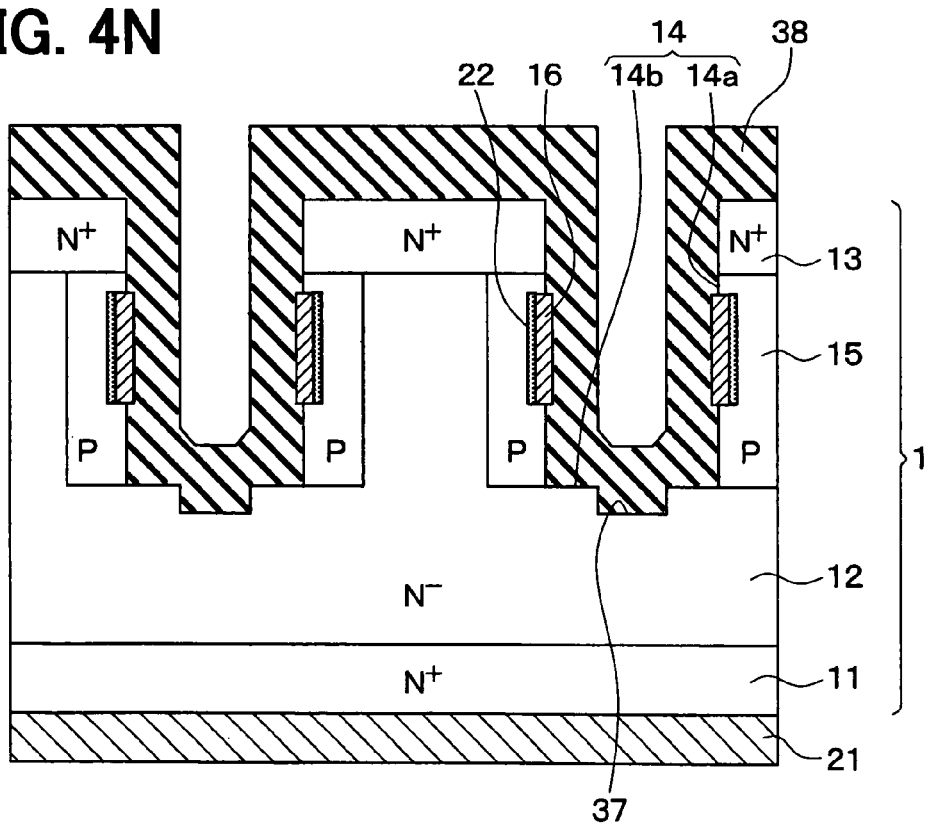

Subsequently, as shown in FIG. 4N, an oxide film 38 is formed so as to extend from on the front surface of the semiconductor substrate 1 to on the trench wall surfaces 14a and 14b and the side walls of the second trenches 37. Incidentally, as will be stated later, the oxide film 38 is employed for the formation of source electrodes 19.

Figure 4O:
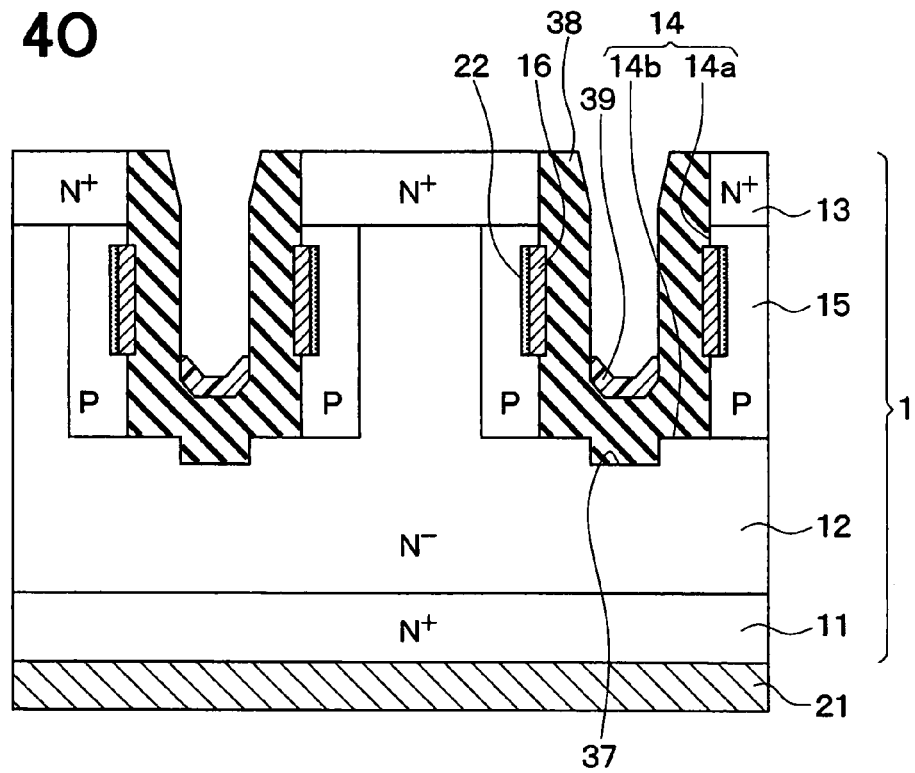

Subsequently, as shown in FIG. 4O, a resist film is formed on the front surface of the oxide film 38 and is thereafter etched back, thereby to leave a resist 39 on only the trench bottom surfaces 14b. Thereafter, those parts of the oxide film 38 which lie on the front surfaces of the N⁺-type source layers 13 are removed by etching in which the resist 39 is used as a mask. Thus, the front surfaces of the N⁺-type source layers 13 are exposed.

Figure 4P:
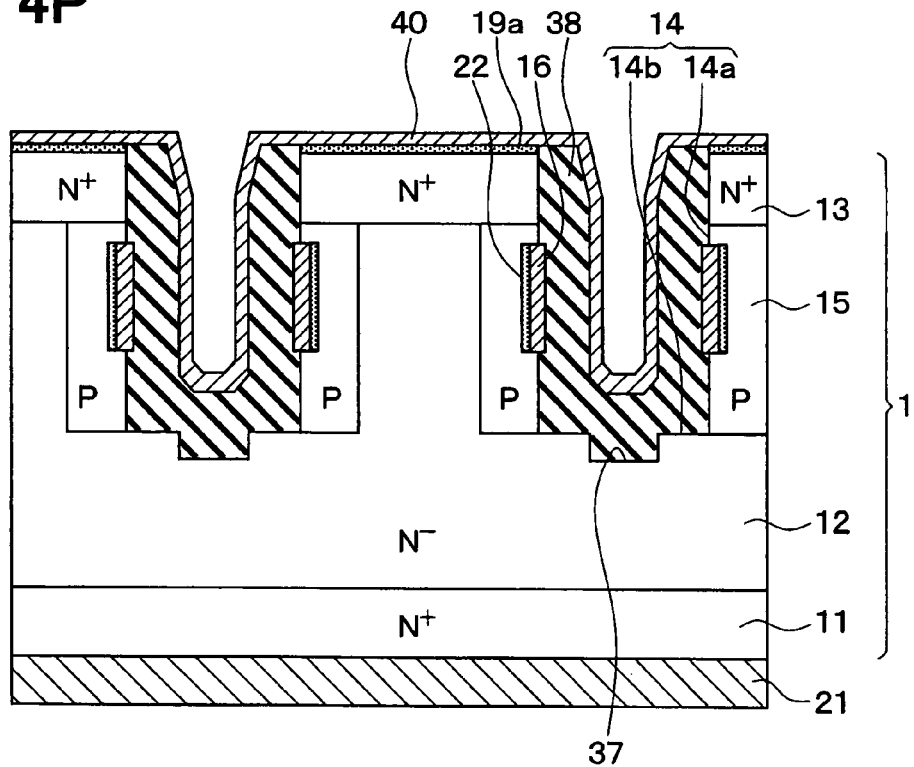

Subsequently, as shown in FIG. 4P, a metal film 40 for the source electrodes 19 is formed on the front surfaces of the N⁺-type source layers 13 and the front surfaces of the oxide films 38. Thereafter, a silicide layer to serve as a contact layer 19a is formed between each N⁺-type source layer 13 and the metal film 40 by performing a heat treatment.

Figure 4Q:
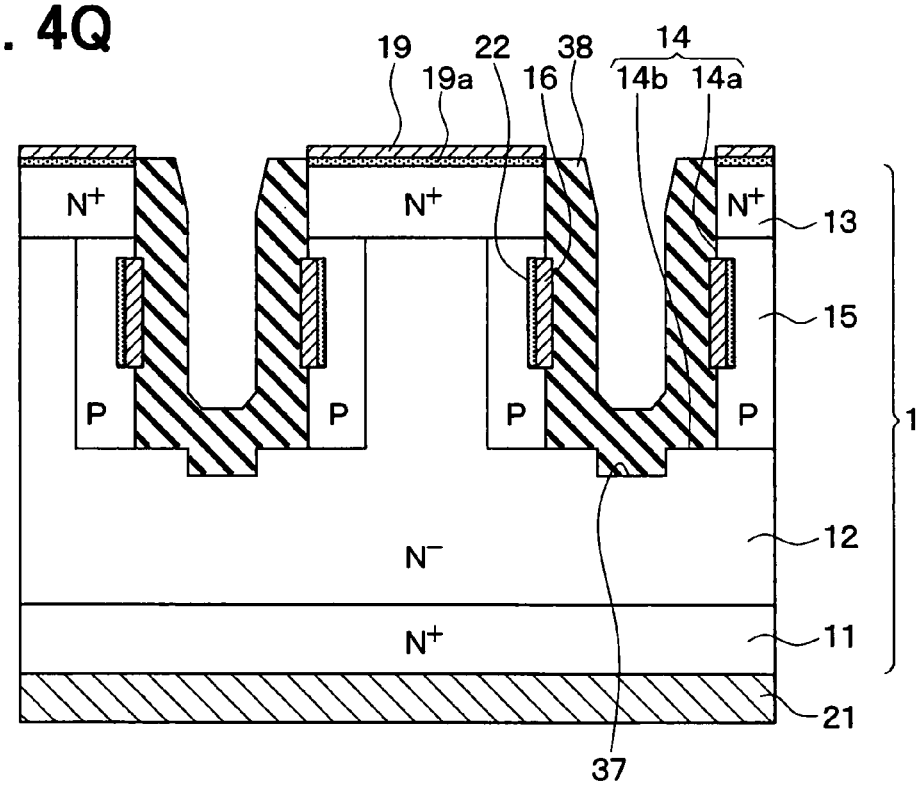

Subsequently, as shown in FIG. 4Q, etching is performed for the metal film 40 so as to leave the silicide layers 19a, whereby those parts of the metal film 40 which lie on the front surfaces of the N⁺-type source layers 13 are left behind, and the other parts are removed. Thus, the source electrodes 19 are formed.

Figure 4R:
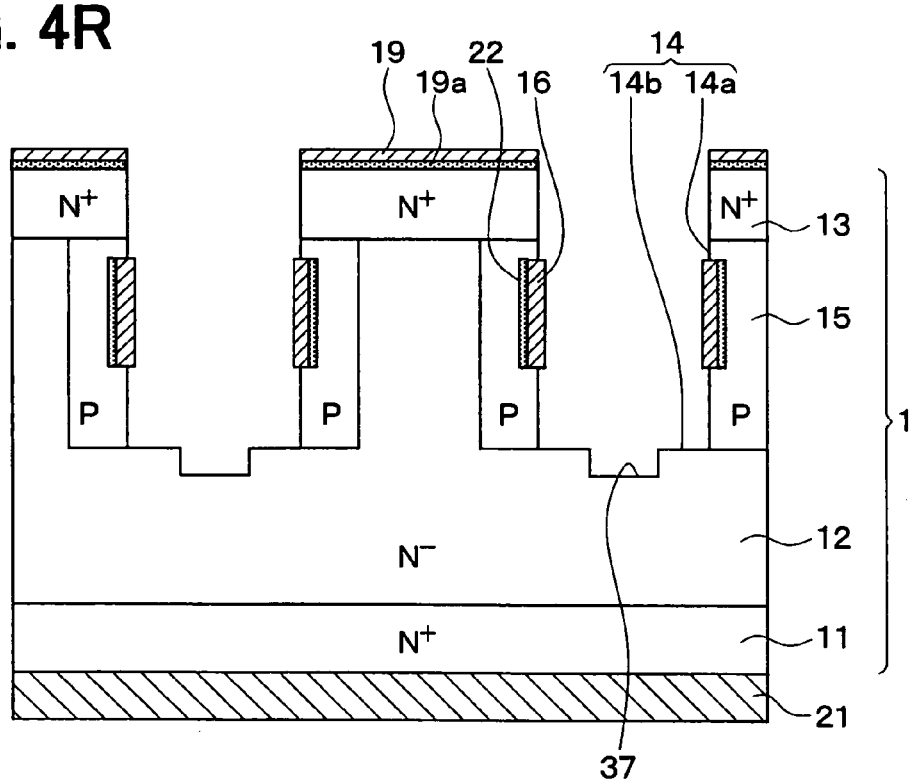

Subsequently, the oxide films 38 are removed as shown in FIG. 4R.

Figure 4S:
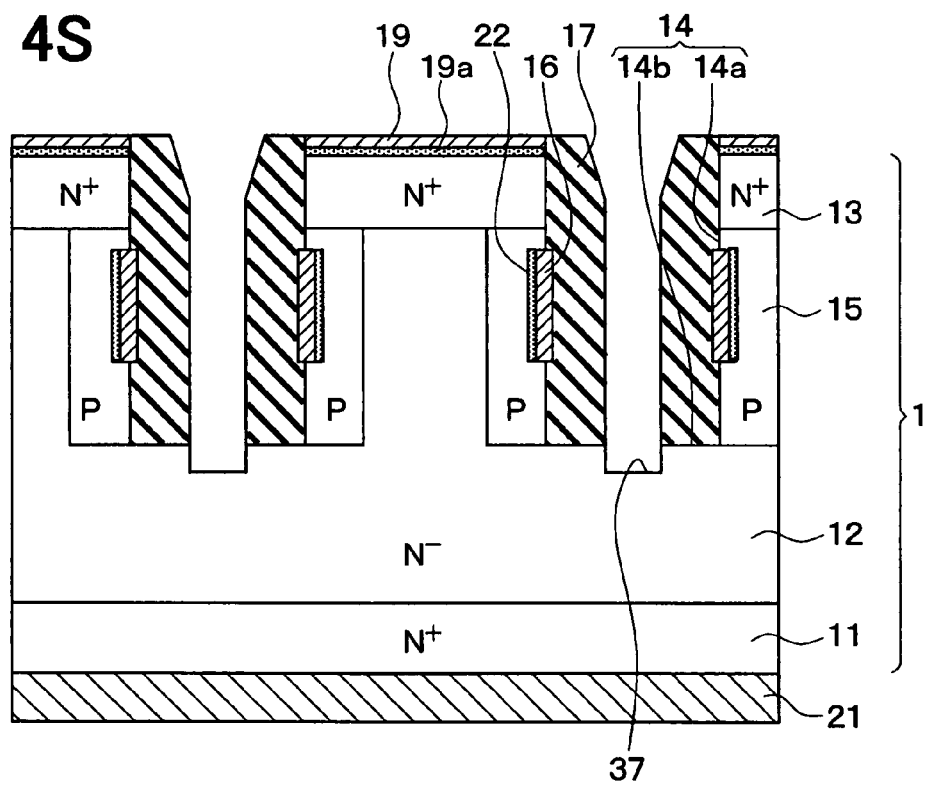

Subsequently, as shown in FIG. 4S, an oxide film is formed again so as to extend from on the front surface of the semiconductor substrate 1 to on the trench wall surfaces 14a and 14b and is etched back, whereby the oxide films are left on only the trench side surfaces 14a among the front surface of the semiconductor substrate 1 and the trench wall surfaces 14a and 14b. Thus, interlayer insulator films 17 are formed.

Incidentally, at the time when the oxide film is formed, its thickness is set at the same magnitude as a distance from each trench side surface 14a to the corresponding second trench 37. Incidentally, owing to the etching-back, each interlayer insulator film 17 assumes a shape in which the thickness of this film 17 in a lateral direction in the figure gradually decreases from the trench bottom surface 14b upwards in the figure.

Figure 4T:
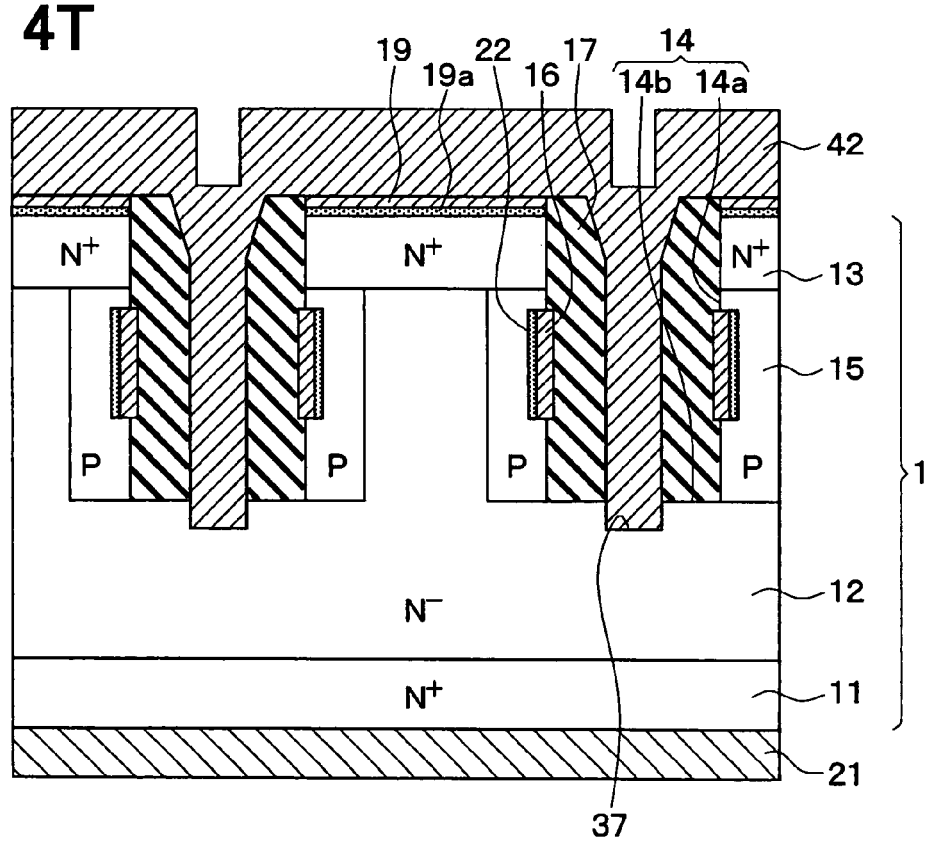
Figure 4U:
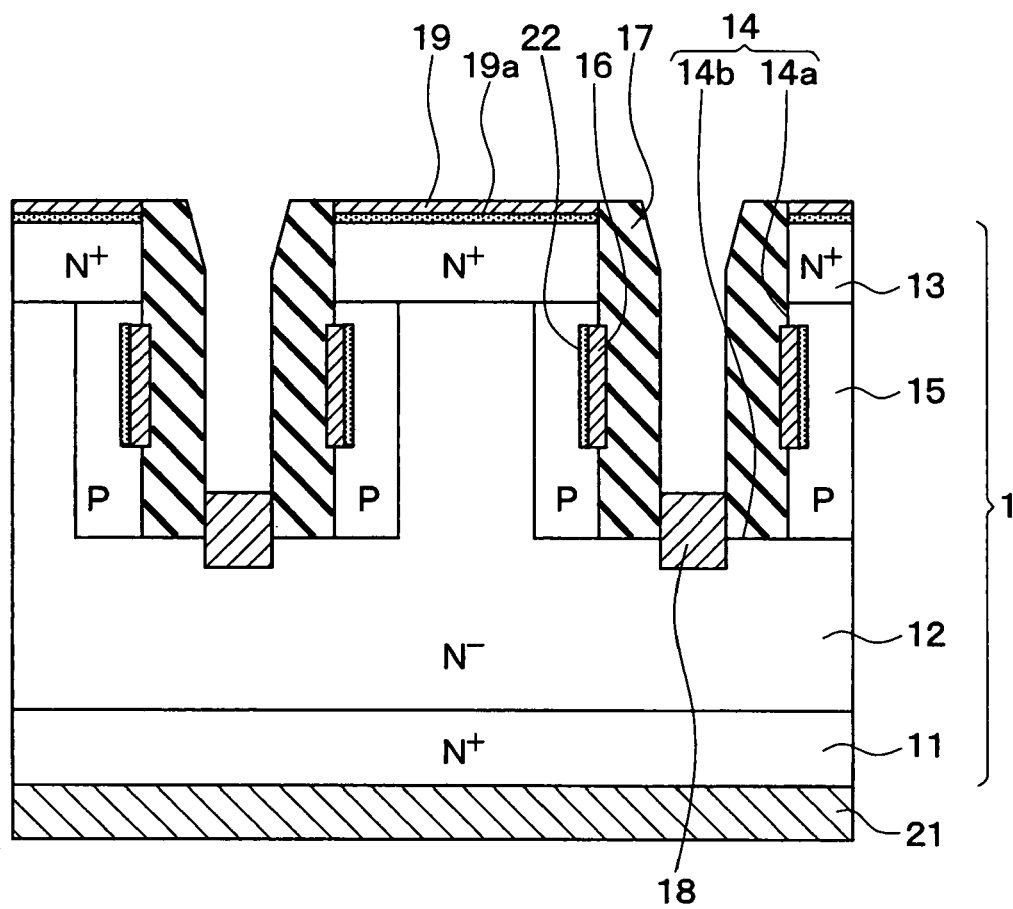

Subsequently, as shown in FIG. 4T, a metal film 42 for forming Schottky electrodes 18 is formed in the inner parts of the trenches 14 and on the front surface of the semiconductor substrate 1.

Subsequently, as shown in FIG. 4U, the metal film 42 is etched back, thereby to form the Schottky electrodes 18. The quantity of the etching-back on this occasion is adjusted at will so that the upper end 18b of each Schottky electrode 18 may become a desired position.

Although no illustration is made, a source wiring electrode 20 is thereafter formed so as to extend from the inner parts of the trenches 14 to on the front surface of the semiconductor substrate 1. Then, the semiconductor device shown in FIG. 2 is manufactured.

Incidentally, the step of FIG. 4U may well be omitted by ending the manufacture in the state of the semiconductor device after the step of FIG. 4T. That is, the metal film 42 for forming the Schottky electrodes 18 can be left behind as it is, so as to use the metal film 42 as the source wiring electrode 20.

Next, the major features of the semiconductor device of this embodiment will be described.

Figure 21:
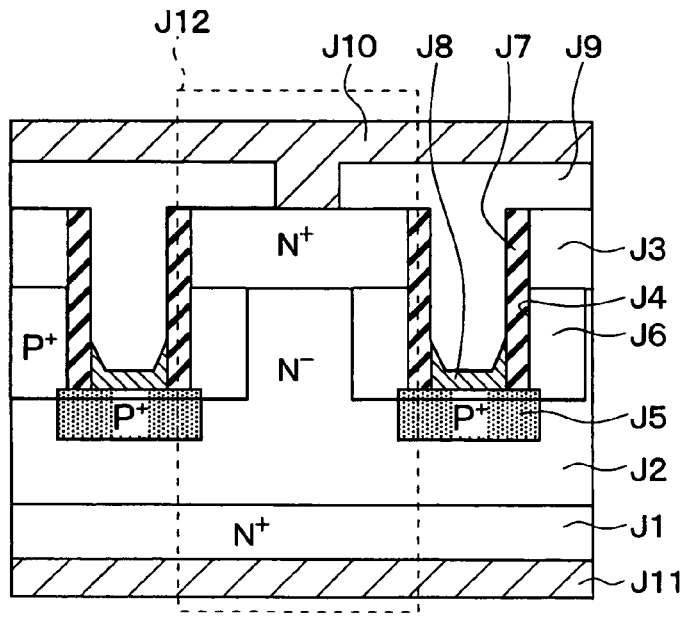
FIG. 21 is a cross sectional view showing a SiC semiconductor device according to a prior art.

(1) In the semiconductor device of the prior-art structure shown in FIG. 21, the region where each trench is formed in a plan layout is merely used as the region for forming the contact of the corresponding gate layer, and it is not the fundamental constituent region of the J-FET, so that it has been, so to speak, the dead space of the cell region.

In contrast, in this embodiment, the Schottky electrode 18 defining the Schottky junction with the N⁻-type drift layer 12 is formed at the bottom part of each trench 14, whereby the Schottky diode 6 which is constituted by the N⁻-type drift layer 12 and the Schottky electrode 18 is assembled in the region formed with the trench in the plan layout as has been the dead space in the prior art.

Accordingly, it can be said that, in the semiconductor device of this embodiment, the diode 6 is built in the chip formed with the J-FET 5, by effectively utilizing part of the cell region.

Besides, the alternative method stated in JP-A-2005-108926 employs the structure in which the diode region is added separately from the J-FET cell region, in the same chip. In this case, the area of the diode region is added to the area of the J-FET cell region, so that the chip becomes larger inevitably.

In contrast, in this embodiment, the Schottky diode 6 is assembled in the cell region. Therefore, unless the trench width is especially altered, the area of the J-FET cell region hardly increases. Accordingly, the Schottky diode 6 can be built in the chip in which the J-FET is formed, without enlarging the chip size.

Besides, in this embodiment, the Schottky diode 6 which is constituted by the Schottky electrode 18 and the N⁻-type drift layer 12 is built in, and the Schottky electrode 18 is connected with the source electrode 19, so that the Schottky diode 6 can be utilized as a body diode for extracting a surge.

(2) According to the manufacturing method of this embodiment, at the step shown in FIG. 4M, each second trench 37 is formed in self-alignment with the corresponding first trench 14, that is, at equal distances from the trench side walls 14a on both sides. This is because, at the step of FIG. 4L, the oxide films 36 are simultaneously formed on the opposing trench side surfaces 14a, so that the thicknesses of the oxide films 36 formed on the trench side surfaces 14a on both the sides can be equalized.

Likewise, at the step shown in FIG. 4S, the oxide film is formed on the trench wall surfaces 14a and 14b and is etched back, whereby the oxide films are left on only the trench side surfaces 14a in the trench wall surfaces 14a and 14b, and the N⁻-type drift layer 12 is exposed at the trench bottom surfaces 14b. In this case, the interlayer insulator films 17 are simultaneously formed on the opposing side surfaces 14a of each trench 14, so that the thicknesses of the interlayer insulator films 17 become equal. Therefore, the Schottky electrode 18 is formed in self-alignment with the trench side surfaces 14a, and hence, distances from the Schottky electrode 18 within the trench 14, to the side walls 14a of the trench 14 on both the sides can be equalized.

Modifications to the structure shown in FIG. 2 will be described below.

Second Example

Figure 5:
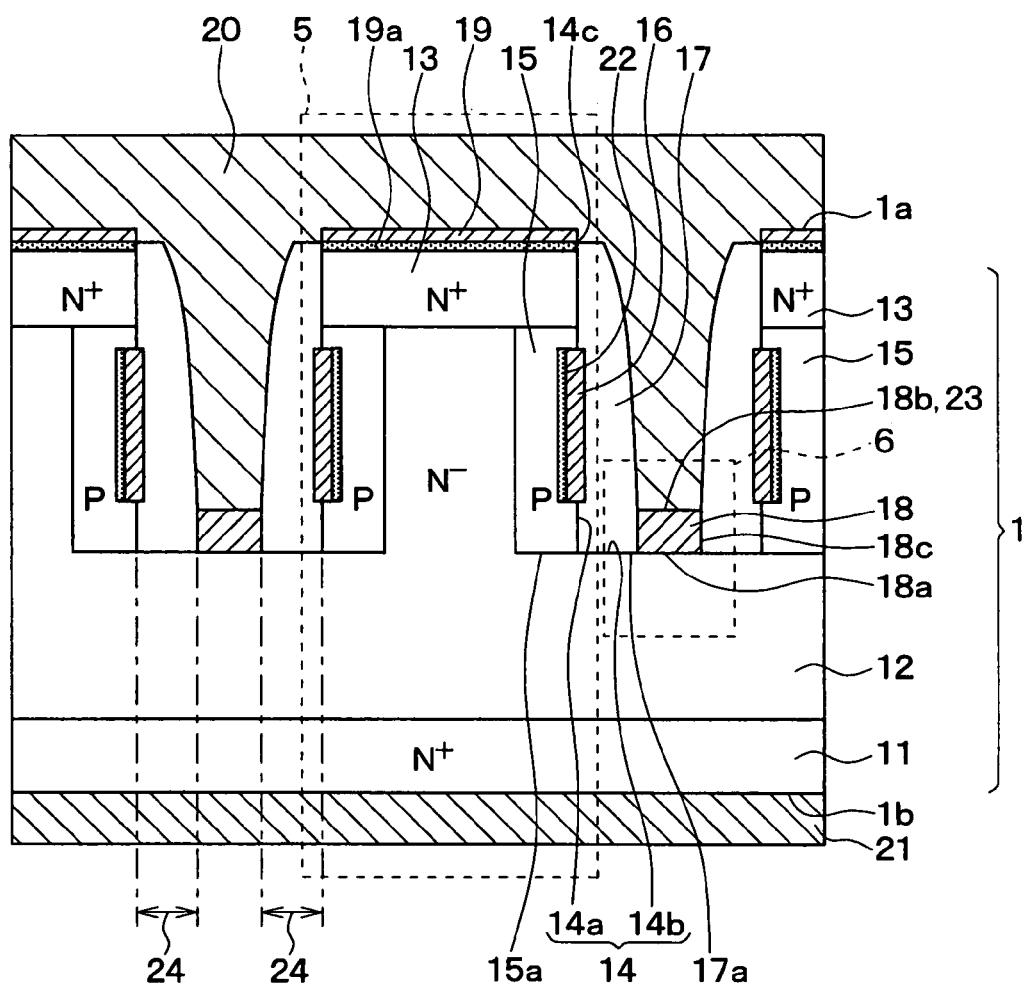
FIG. 5 is a cross sectional view showing a SiC semiconductor device according to a second example of the first embodiment.

FIG. 5 shows a sectional view of a semiconductor device in the second example of this embodiment. In a structure shown in FIG. 5, the position of the lower end part 18a of each Schottky electrode 18 in the thickness direction of a substrate 1 is the same as the position of a trench bottom surface 14b, that is, the position of the lower end part 17a of each interlayer insulator film 17, and it is the same as the position of the lower end part 15a of each P-type gate layer 15.

FIGS. 6A to 6F show a manufacturing process for the semiconductor device of this structure. In the second example, after the steps shown in FIGS. 4A to 4K, steps shown in FIGS. 6A to 6F are performed in succession.

Figure 6A:
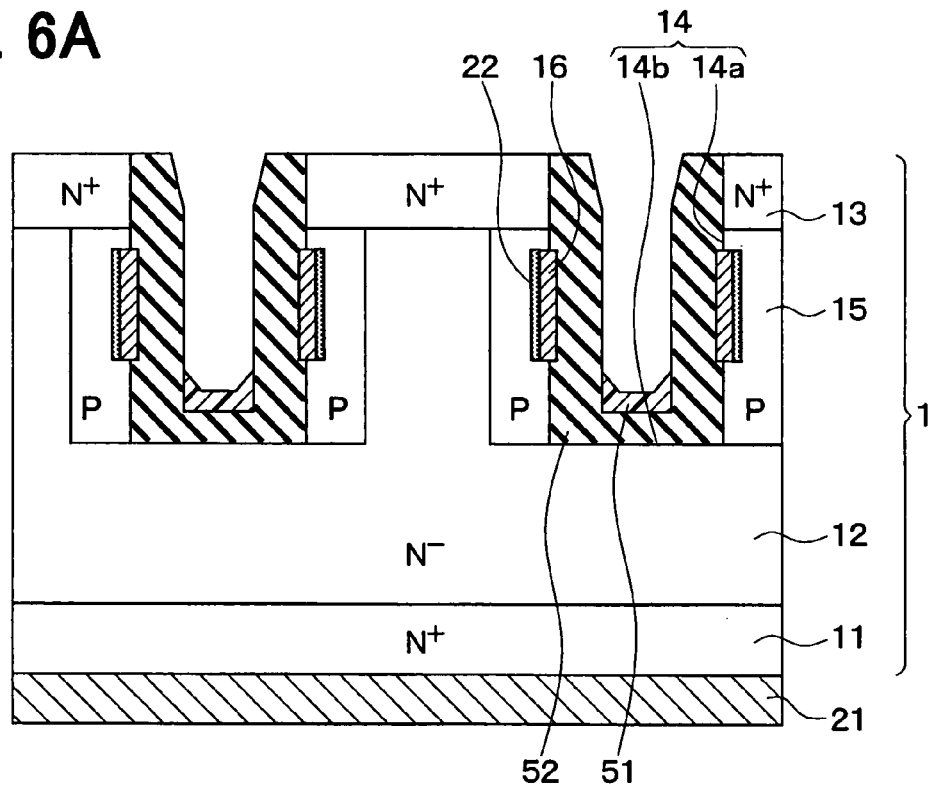
FIGS. 6A to 6F are cross sectional views explaining a method for manufacturing the device in FIG. 5.

The oxide films 33 in the trenches 14 are removed as shown in FIG. 4K. Thereafter, as shown in FIG. 6A, an oxide film is formed on the inner walls 14a and 14b of trenches 14 and the front surface of the semiconductor substrate 1, and a resist 51 is formed on only those parts of the oxide film which overlie the trench bottom surfaces 14b. Etching which employs the resist 51 as a mask is performed to remove the oxide film on the front surface of the semiconductor substrate 1 and to leave the oxide films 52 on the inner walls 14a and 14b of the trenches 14. Thereafter, the resist 51 is removed.

Figure 6B:
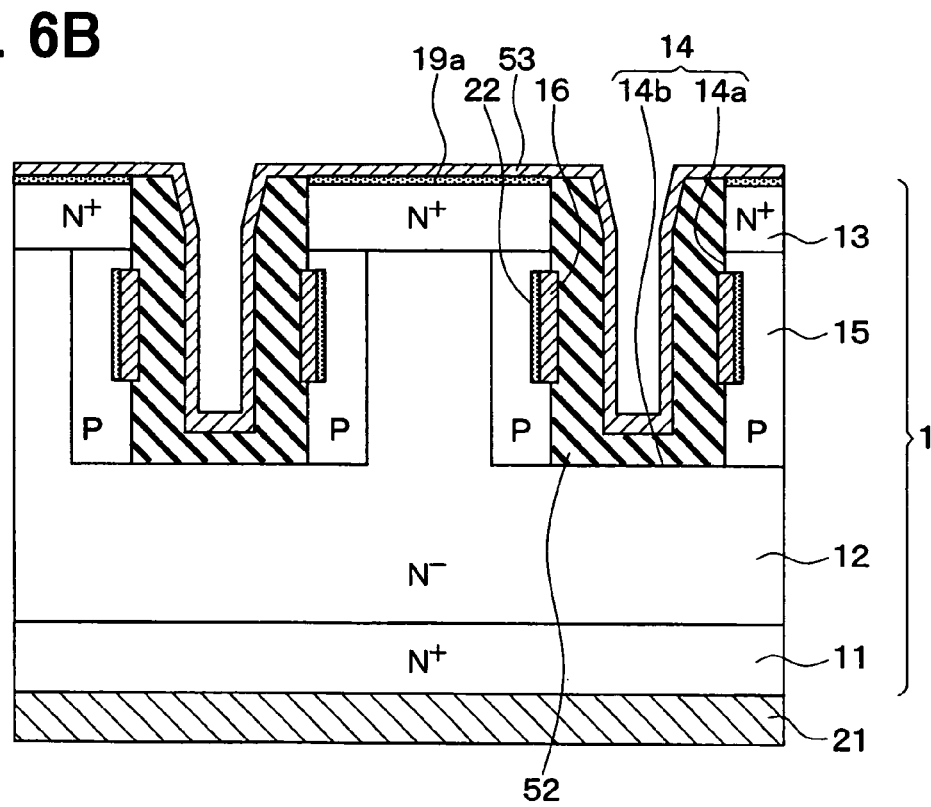

Subsequently, as shown in FIG. 6B, a metal film 53 for forming source electrodes 19 is formed on the front surfaces of the oxide films 52 and the front surface of the semiconductor substrate 1. Besides, silicide layers to become contact layers 19a are formed between N⁺-type source layers 13 and the metal film 53 by performing a heat treatment.

Figure 6C:
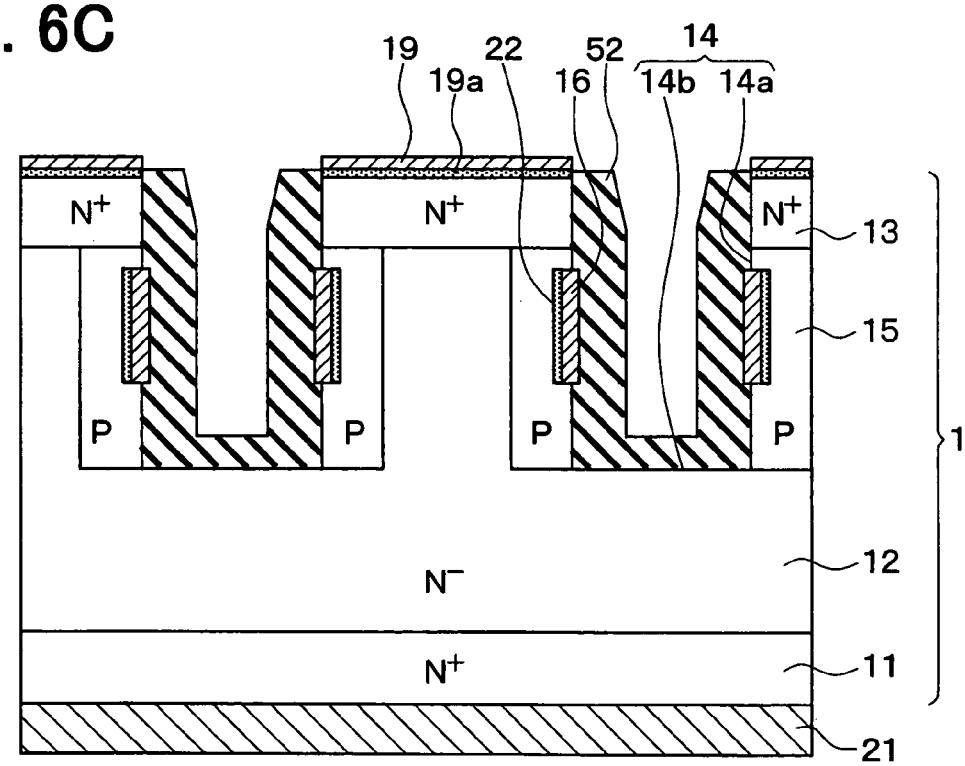

Subsequently, as shown in FIG. 6C, the metal film 53 is etched so as to leave the silicide layers 19a, whereby those parts of the metal film 53 which overlie the front surfaces of the N⁺-type source layers 13 are left behind, and the other parts are removed. Thus, the source electrodes 19 are formed. Thereafter, the oxide films 52 are removed.

Figure 6D:
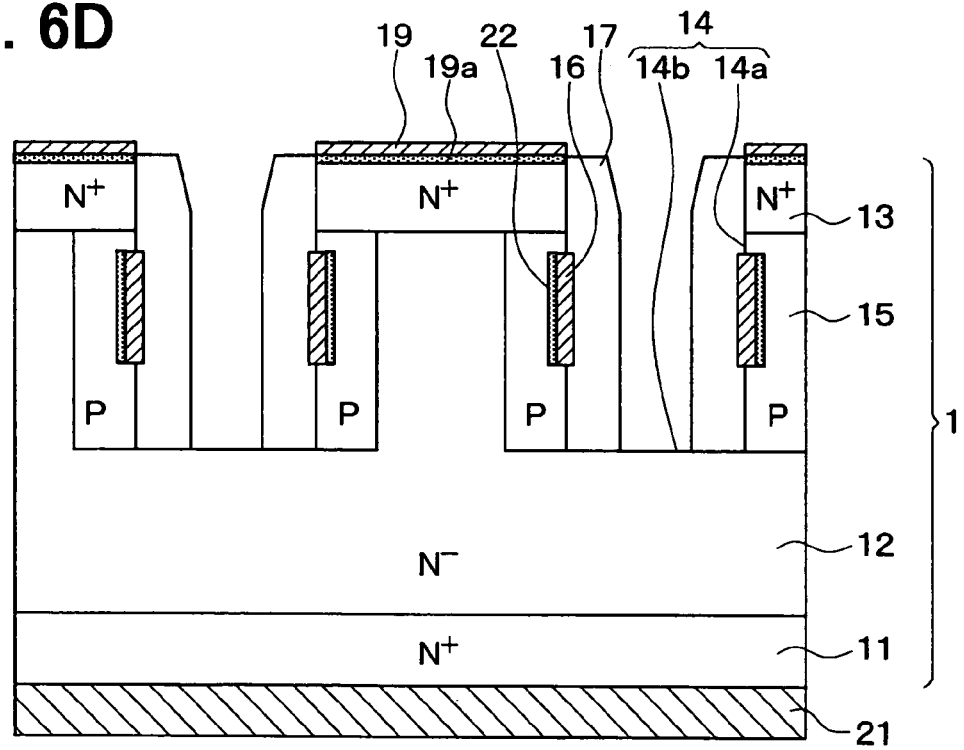

Subsequently, as shown in FIG. 6D, an oxide film is formed on the inner walls 14a and 14b of the trenches 14 and the front surface of the semiconductor substrate 1 and is etched back, thereby to remove the oxide films on the trench bottom surfaces 14b and to leave the oxide films on only the trench side surfaces 14a. Thus, the interlayer insulator films 17 are formed, and an N⁻-type drift layer 12 is exposed at the trench bottom surfaces 14b.

Figure 6E:
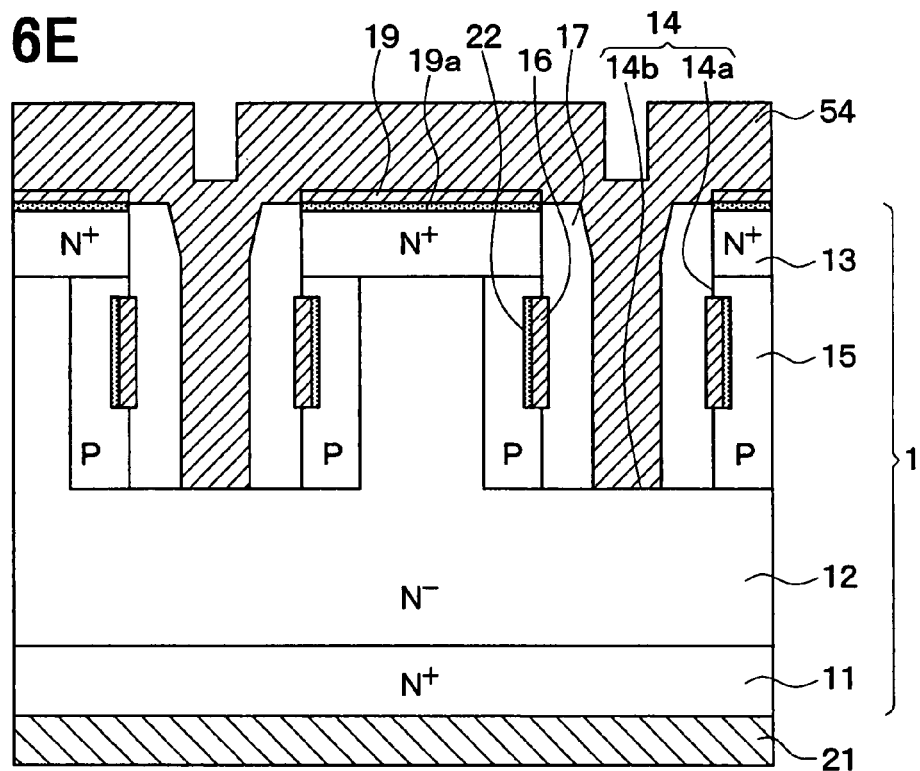

Subsequently, as shown in FIG. 6E, a metal film 54 for forming Schottky electrodes 18 is formed in the inner parts of the trenches 14 and on the front surface of the semiconductor substrate 1.

Figure 6F:
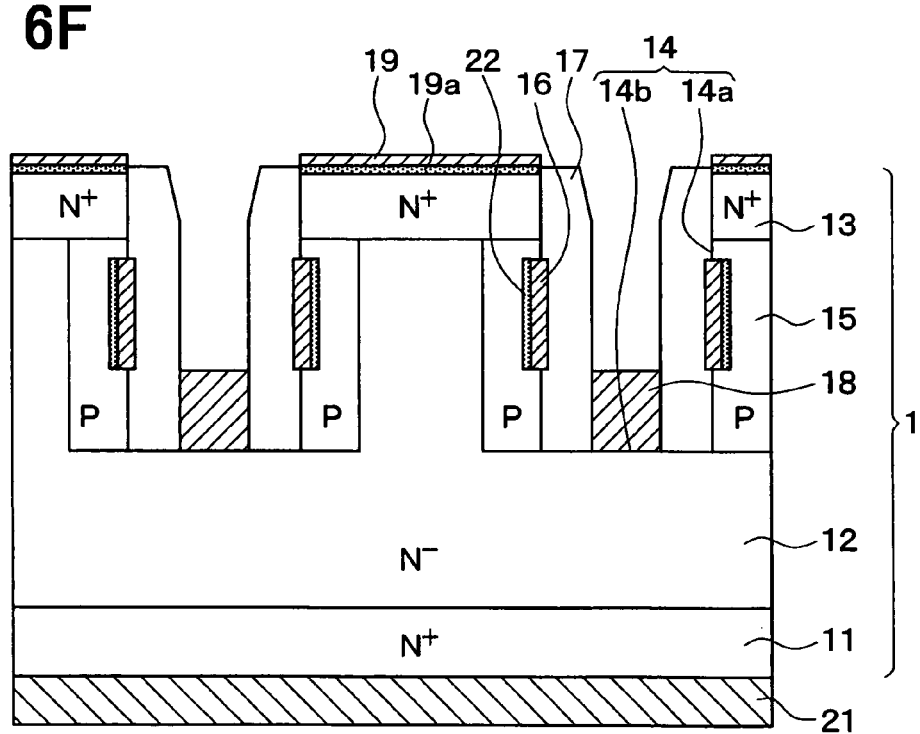

Subsequently, as shown in FIG. 6F, the metal film 54 is etched back, thereby to form the Schottky electrodes 18.

Although no illustration is made, a source wiring electrode 20 is thereafter formed so as to extend from the inner parts of the trenches 14 to on the front surface of the semiconductor substrate 1. Then, the semiconductor device shown in FIG. 5 is manufactured.

Also in the semiconductor device of this structure, it can be said as in the first example that a diode 6 is built in a chip formed with a J-FET 5, by effectively utilizing part of a cell region.

Besides, at the step shown in FIG. 6D, the oxide film is formed on the trench wall surfaces 14a and 14b and is etched back, thereby to form the interlayer insulator films 17. As in the first example, therefore, the Schottky electrode 18 can be formed in self-alignment with the corresponding trench side surfaces 14a.

Here, the first and second examples will be compared.

In the first example, as shown in FIG. 2, the lower end surface 18a of each Schottky electrode 18 and part of the side surface 18c of this Schottky electrode are connected with the N⁻-type drift layer 12, whereas in the second example, as shown in FIG. 5, only the lower end surface 18a of each Schottky electrode 18 is connected with the N⁻-type drift layer 12.

Accordingly, on condition that the area of the lower end part 18a of the Schottky electrode 18 is identical, the junction area between the Schottky electrode 18 and the N⁻-type drift layer 12 is larger when the lower end part 18a of the Schottky electrode 18 is located below the lower end part 17a of the corresponding interlayer insulator film 17 as in the first example, than when it is at the same position as that of the lower end part 17a of the corresponding interlayer insulator film 17 as in the second example. Therefore, the structure of the first example as shown in FIG. 2 is lower in the resistance of the Schottky diode 6 as compared with the structure of the second example as shown in FIG. 5.

Besides, when the lower end part 18a of the Schottky electrode 18 is located below the lower end part 15a of each of the corresponding P-type gate layers 15 as shown in FIG. 2 illustrative of the first example, the electric field concentration of the drift layer 12 in the vicinity of the lower corner part of each P-type gate layer 15 as occurs at the application of a voltage to the drain of the J-FET can be relaxed more than when the lower end part 18a of the Schottky electrode 18 is at the same position as that of the lower end part 15a of the P-type gate layer 15 as shown in FIG. 5 illustrative of the second example. Therefore, the withstand voltage of the J-FET 5 can be made higher by the first example than by the second example. Accordingly, the first example is more favorable than the second example from the viewpoints of lowering the resistance of the Schottky diode 6 and heightening the withstand voltage of the J-FET 5.

Besides, the manufacturing methods of the first and second examples will be compared. In the second example, the second trenches as in the first example need not be formed, that is, the steps shown in FIGS. 4L and 4M are unnecessary.

Accordingly, the second example is more favorable than the first example from the viewpoint of simplifying the manufacturing process.

Third Example

Figure 7:
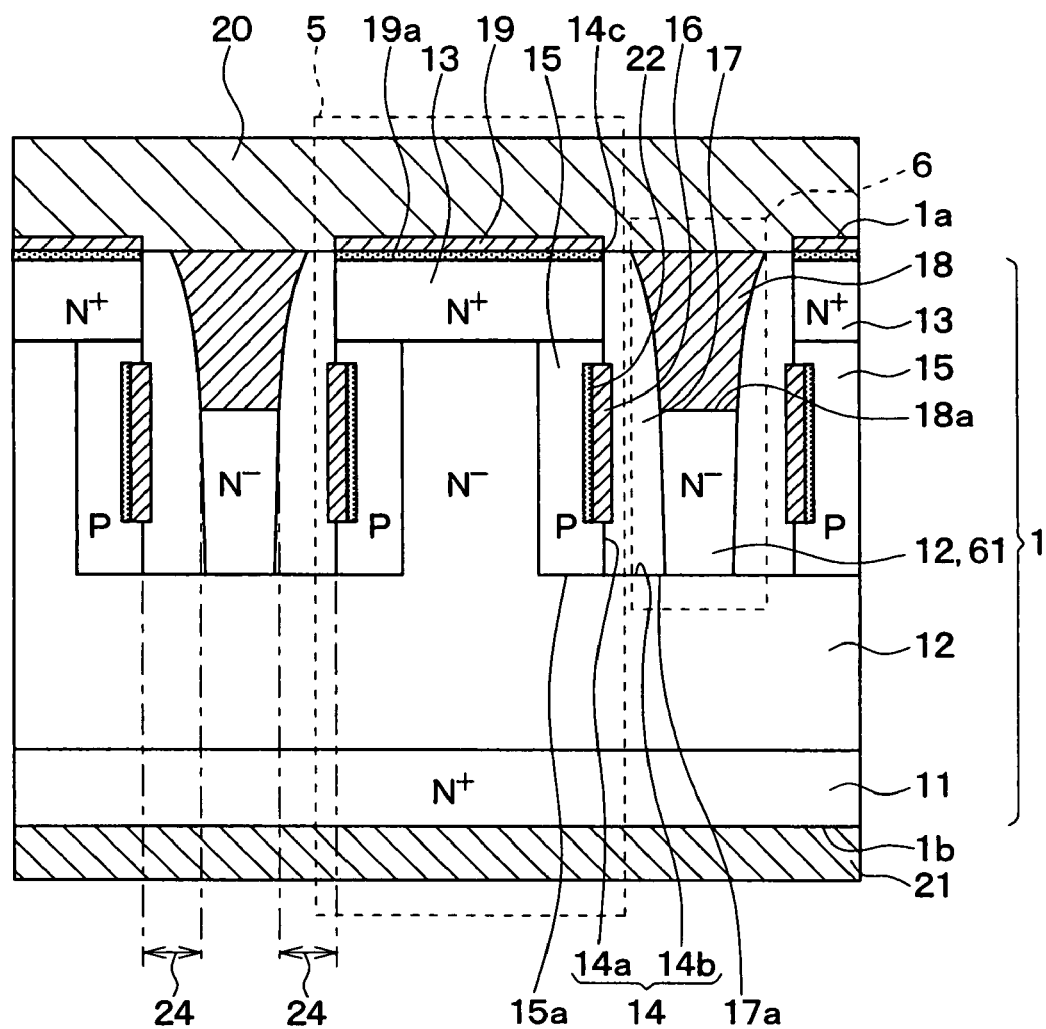
FIG. 7 is a cross sectional view showing a SiC semiconductor device according to a third example of the first embodiment.

FIG. 7 shows a sectional view of a semiconductor device in the third example of this embodiment. As in the third example, the position of the lower end part 18a of each Schottky electrode 18 can be made higher than in the first and second examples.

In the structure shown in FIG. 7, an N⁻-type drift layer 12 is located also at the lower half of the inner part of each trench 14, and the Schottky electrode 18 is arranged at the upper half of the inner part of the trench 14. This structure can be manufactured by forming each N⁻-type layer 61 in such a way that the N⁻-type layer 61 is epitaxially grown in the trench interior before the metal film 54 is formed in the trench interior at the step shown in FIG. 6E illustrative of the second example. By the way, in this case, a film of excellent heat resistance enduring an epitaxial temperature is employed as each interlayer insulator film 17.

Fourth, Fifth and Sixth Examples

Figure 8:
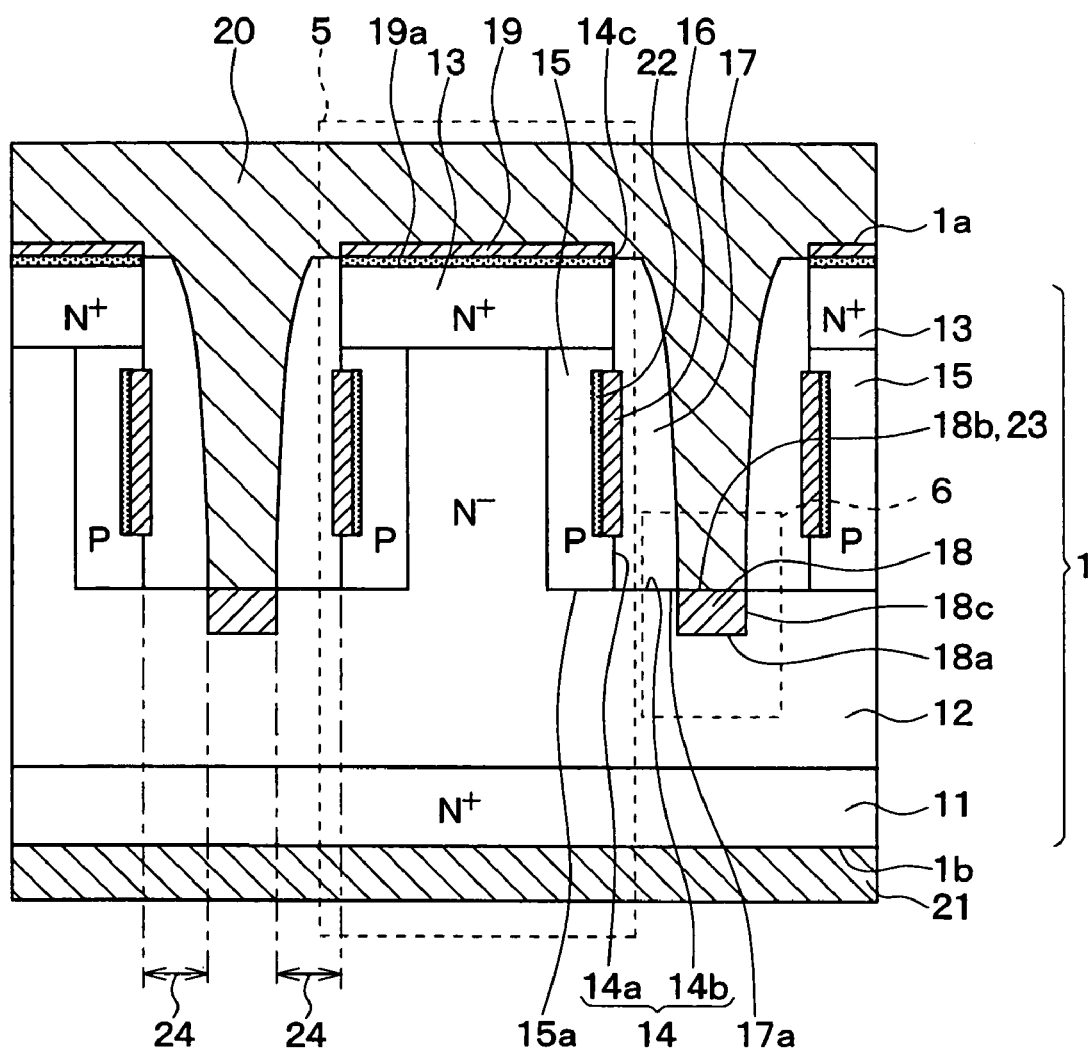
FIG. 8 is a cross sectional view showing a SiC semiconductor device according to a fourth example of the first embodiment.
Figure 9:
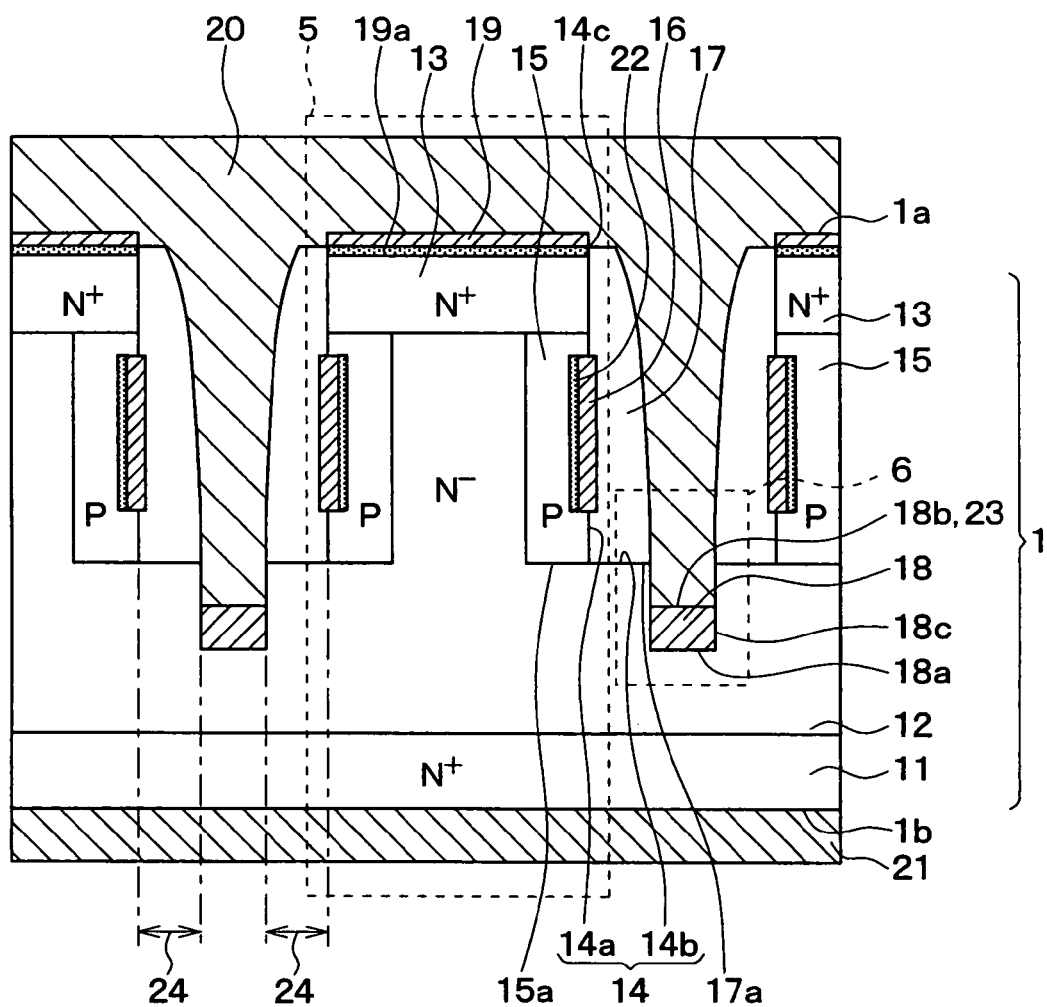
FIG. 9 is a cross sectional view showing a SiC semiconductor device according to a fifth example of the first embodiment.
Figure 10:
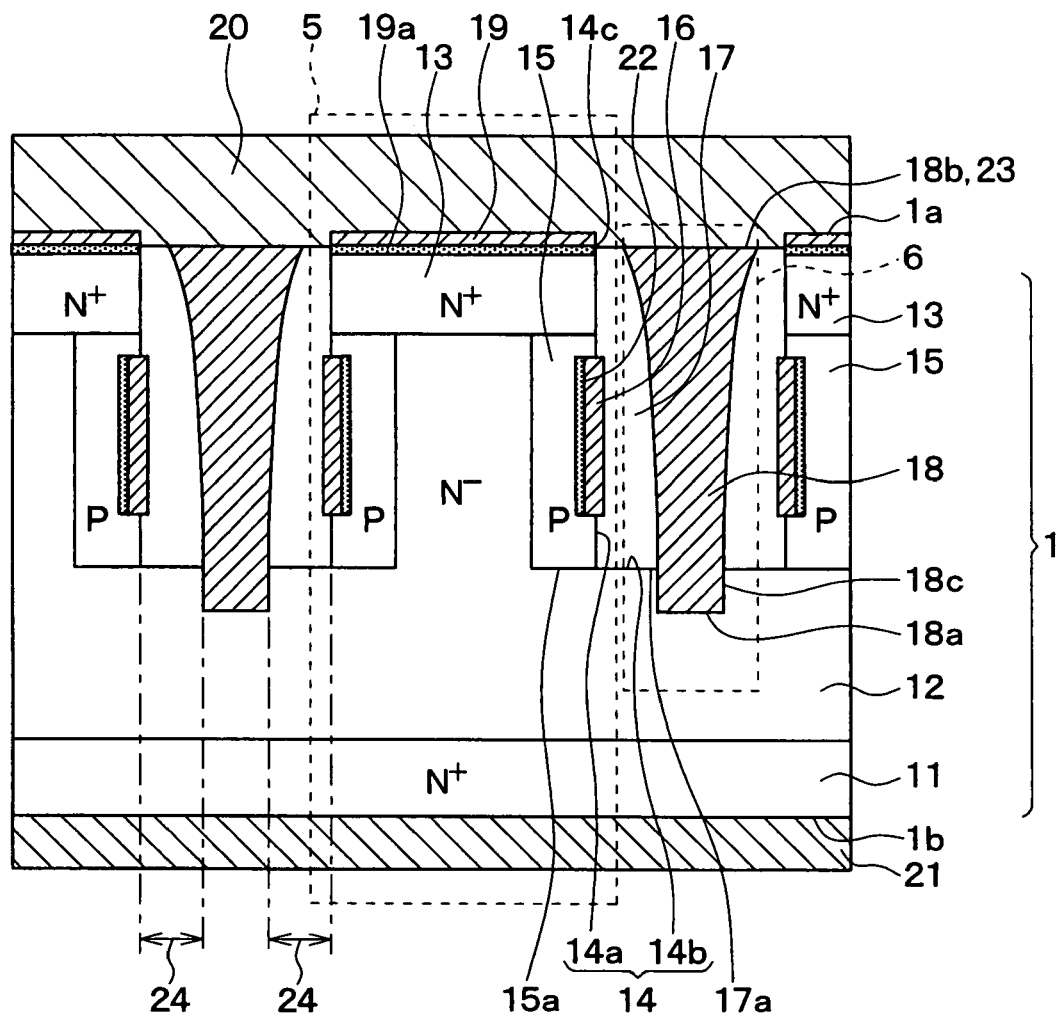
FIG. 10 is a cross sectional view showing a SiC semiconductor device according to a sixth example of the first embodiment.

FIGS. 8, 9 and 10 show sectional views of semiconductor devices in the fourth, fifth and sixth examples of this embodiment, respectively. The fourth, fifth and sixth examples are examples in which the position of the upper end part 18b of each Schottky electrode 18, namely, the position of the connection part 23 between each Schottky electrode 18 and a source wiring electrode 20 is altered with respect to the first example.

The position of the upper end part 18b of the Schottky electrode 18 can be set at the same position as that of a trench bottom surface 14b as shown in FIG. 8, it can be set at a position lower than the trench bottom surface 14b as shown in FIG. 9, and it can be set at the same position as that of the upper end of a trench 14 as shown in FIG. 10. Incidentally, the semiconductor devices of these structures can be manufactured by adjusting the etching-back quantity of the metal film 42 at the step shown in FIG. 4U.

For reasons to be stated below, however, the position of the upper end part 18b of the Schottky electrode 18 may preferably be above the trench bottom surface 14b and below the upper end 14c of the trench 14 and may more preferably be lower than the half of the trench depth, as shown in the first example.

In a case where, as shown in FIG. 9, the connection part 23 between the Schottky electrode 18 and the source wiring electrode 20 is located below the trench bottom surface 14b, not only the Schottky electrode 18, but also the source wiring electrode 20 defines a Schottky junction with an N⁻-type drift layer 12. That is, a Schottky diode which is based on the N⁻-type drift layer 12 and the source wiring electrode 20 is also formed. Therefore, the characteristics of a Schottky diode formed at a trench bottom part become different from intended characteristics.

In contrast, as shown in FIG. 2, in the first example, the Schottky junction between the N⁻-type drift layer 12 and the source wiring electrode 20 is not formed, and only the Schottky junction between the Schottky electrode 18 and the N⁻-type drift layer 12 is formed, so that the intended characteristics of the Schottky diode are attained according to the first example. Accordingly, the position of the upper end part 18b of the Schottky electrode 18 may preferably be set above the trench bottom surface 14b.

Besides, in a case where the upper end part 18b of the Schottky electrode 18 is located up to the upper end of the trench 14 as shown in FIG. 10 or is located to be still higher than the upper end of the trench 14, the resistance of the Schottky diode 6 increases more than in the case where the upper end part 18b of the Schottky electrode 18 is located at the inner part of the trench 14. Therefore, the position of the upper end part 18b of the Schottky electrode 18 may preferably be below the upper end of the trench 14 as in the first example.

As described in the second to sixth examples, the position of the Schottky electrode 18 can be altered at will within a trench region formed with the trench, in a plan layout.

Seventh Example

Figure 11:
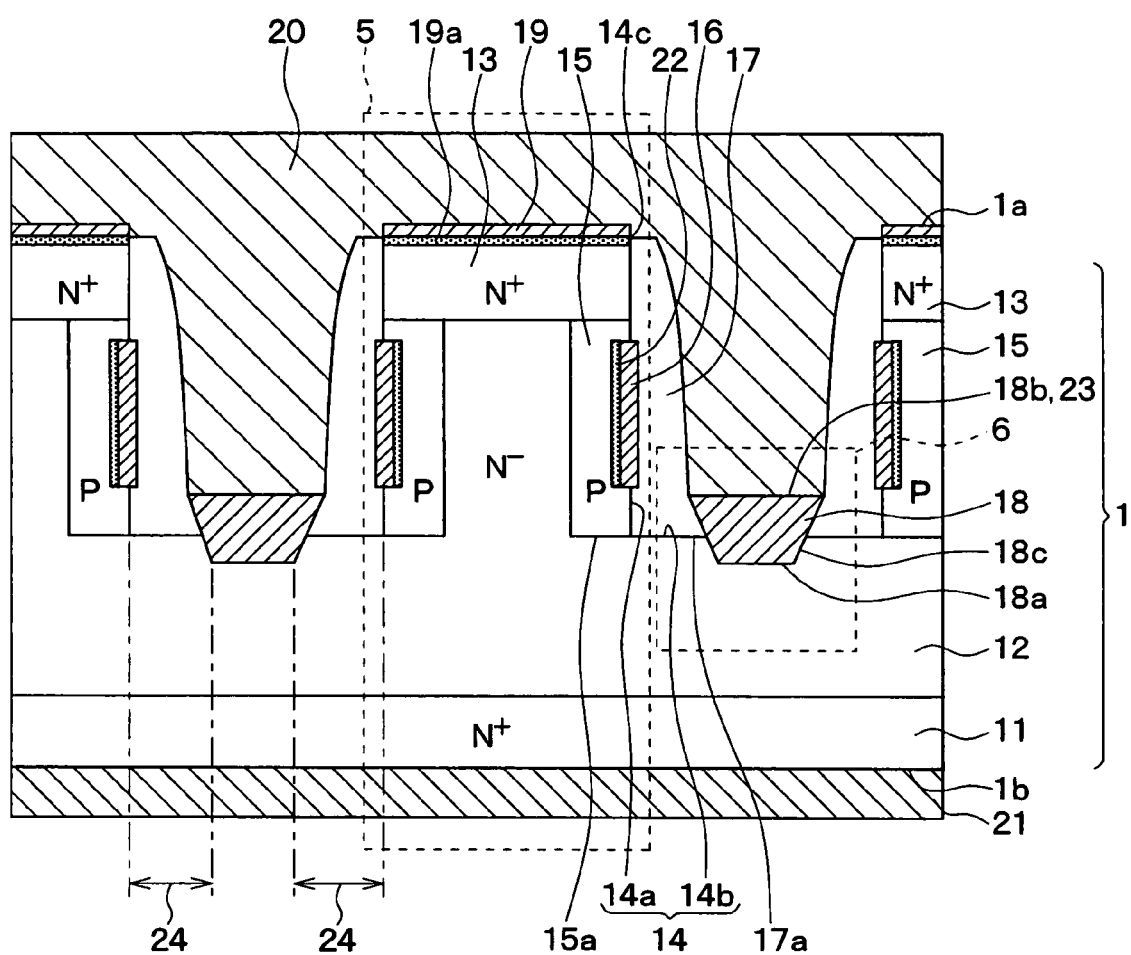
FIG. 11 is a cross sectional view showing a SiC semiconductor device according to a seventh example of the first embodiment.

FIG. 11 shows a sectional view of a semiconductor device in the seventh example of this embodiment. The seventh example is an example in which the shape of a Schottky electrode 18 is altered with respect to the first example. More specifically, in a structure shown in FIG. 11, the width of the upper end part 18b of the Schottky electrode 18 is greater than the width of the lower end part 18a thereof, and the sectional shape of the Schottky electrode 18 is a trapezoid in which a lower base is shorter than an upper base.

In a case where the Schottky electrode 18 is brought into such a shape, the width of each trench 14 becomes larger by a component by which the upper end part 18b of the Schottky electrode 18 is longer than the lower end part 18a thereof, than in the first example in which the interval between the Schottky electrode 18 and the gate wiring electrode 16 is the same as the width of the lower end part 18a. In the structure shown in FIG. 11, therefore, a cell size becomes larger than in the structure of the first example as shown in FIG. 2.

In other words, in the case where, as in the first example, the width of the connection part 23 between the Schottky electrode 18 and the source wiring electrode 20 is the same as the width of the lower end part 18a of the Schottky electrode 18, the cell size can be minimized by setting the width of the lower end part 18a at the required minimum value.

Eighth Example

Figure 12:
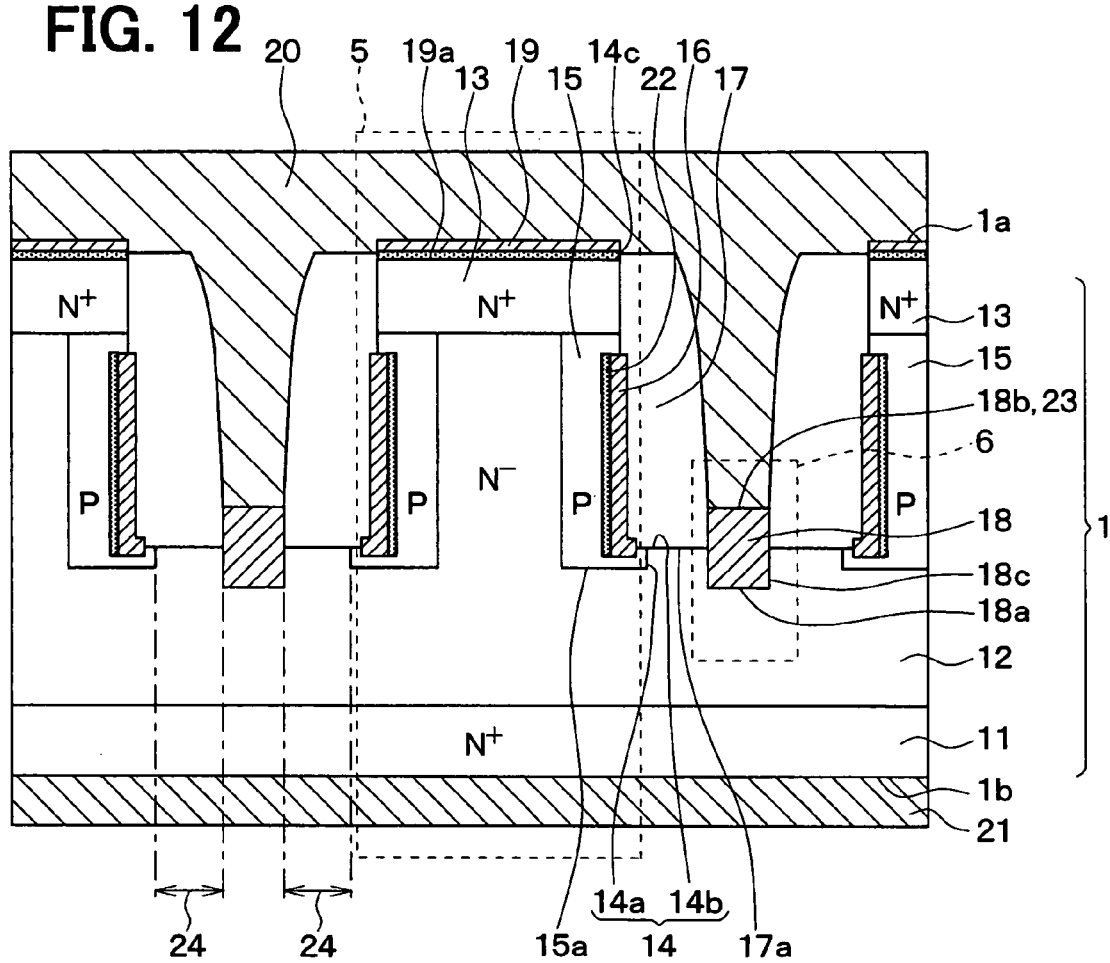
FIG. 12 is a cross sectional view showing a SiC semiconductor device according to an eighth example of the first embodiment.

FIG. 12 shows a sectional view of a semiconductor device in the eighth example of this embodiment. The eighth example is an example in which the shapes of each P-type gate layer 15 and each gate wiring electrode 16 are altered with respect to the first example. More specifically, in a structure shown in FIG. 12, the P-type gate layer 15 and the gate wiring electrode 16 are formed along the bottom surface 14b of a trench 14 from the side surface 14a thereof. However, the P-type gate layer 15 and the gate wiring electrode 16 are spaced from a Schottky electrode 18.

In this manner, the P-type gate layer 15 and the gate wiring electrode 16 can be shaped so as to face, not only to the side surface 14a of the trench 14, but also to the bottom surface 14b thereof. In this case, however, when the interval 24 between the P-type gate layer 15 and the Schottky electrode 18 is made the same as in the structure shown in FIG. 2, a trench width becomes larger in the structure shown in FIG. 12, and hence, a cell size becomes larger.

Accordingly, when the P-type gate layer 15 and the gate wiring electrode 16 are formed on only the side surface 14a of the trench 14, the trench width can be made smaller, and a unit cell can be made smaller than when the P-type gate layer 15 and the gate wiring electrode 16 are formed along the bottom surface 14b of the trench 14 from the side surface 14a thereof. Therefore, the first example is more favorable than the eighth example.

Incidentally, also in the structure shown in FIG. 12, the lower end part 18a of the Schottky electrode 18 is located below the lower end part 15a of the P-type gate layer 15 in the same manner as in the first example. Therefore, the electric field concentration of a drift layer 12 in the vicinity of the lower corner part of the P-type gate layer 15 as occurs at the application of a voltage to a drain can be relaxed more than when the lower end part 18a of the Schottky electrode 18 is at the same position as that of the lower end part 15a of the P-type gate layer 15.

Ninth Example

Figure 13:
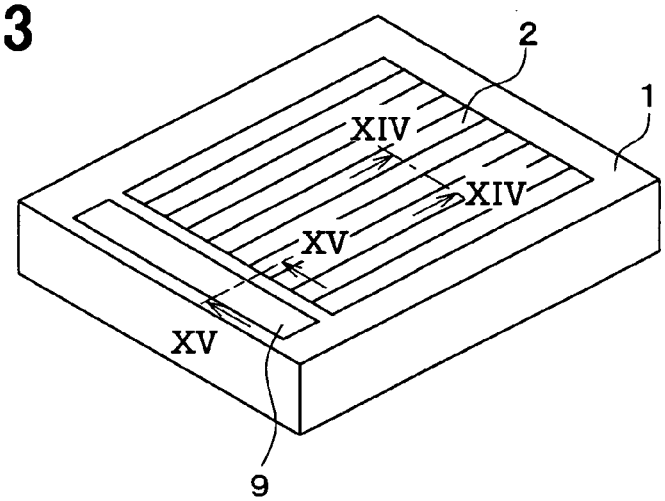
FIG. 13 is a plan view showing a SiC semiconductor device according to a ninth example of the first embodiment.
Figure 14:
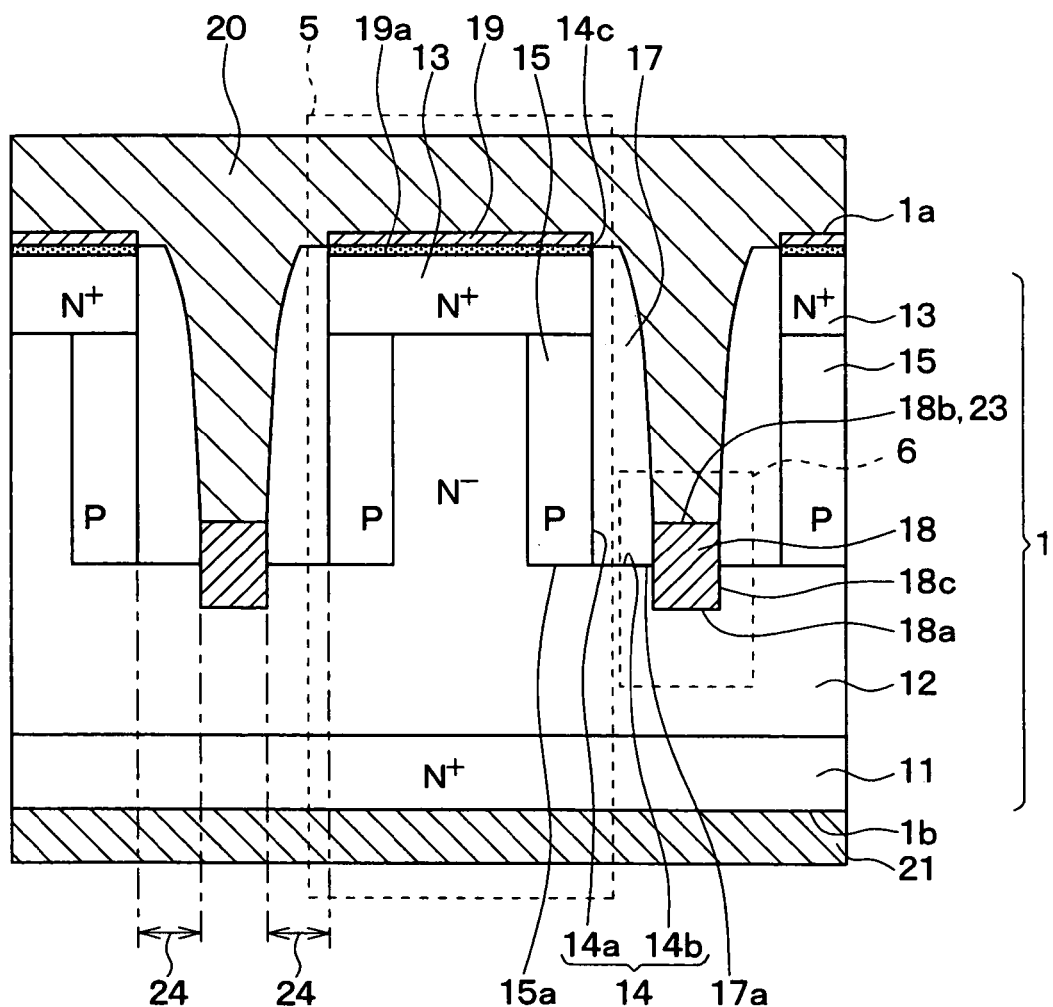
FIG. 14 is a cross sectional view showing the device taken along line XIV-XIV in FIG. 13.
Figure 15:
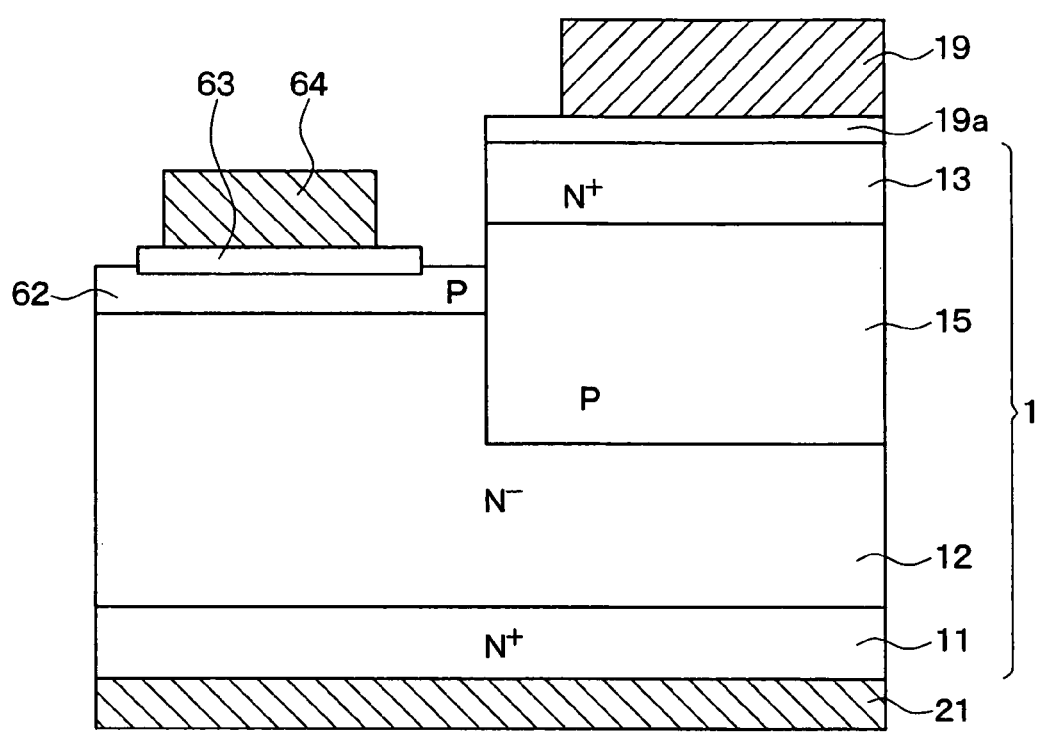
FIG. 15 is a cross sectional view showing the device taken along line XV-XV in FIG. 13.

FIG. 13 shows a perspective view of a semiconductor device in the ninth example of this embodiment, and FIG. 14 shows a sectional view of the semiconductor device seen in the direction of arrows XIV-XIV indicated in FIG. 13, while FIG. 15 shows a sectional view of the semiconductor device seen in the direction of arrows XV-XV indicated in FIG. 13.

In the first example, as shown in FIG. 2, the gate wiring electrode 16 is formed at the inner part of the trench 14 of the cell region 2, and the gate contact is established at the inner part of the trench 14. It is also allowed, however, to adopt a structure in which, as shown in FIG. 13, a semiconductor substrate 1 is provided with a gate contact region 9 different from the cell region 2, so as to establish a gate contact in the gate contact region 9.

In this case, as shown in FIG. 14, the sectional structure of the cell region 2 is a structure in which the gate wiring electrode 16 and the contact layer 22 are omitted from the structure shown in FIG. 2. On the other hand, in the gate contact region 9, as shown in FIG. 15, a P-type layer 62 communicating with the P-type gate layer 15 of the cell region 2 is formed on the front surface side of an N$^-$-type drift layer 12, and the P-type layer 62 is electrically connected with a gate electrode 64 through a contact layer 63.

Incidentally, the gate contact region 9 is formed, for example, in such a way that the semiconductor substrate 1 shown in FIG. 4A has the N$^+$-type source layer 13 removed and is thereafter subjected to the ion implantation of Al (aluminum) or the like, thereby to form the P-type layer 62, on which the contact layer 63 and the gate electrode 64 are formed by well-known methods.

Here, the first and ninth examples will be compared. In the first example, the gate wiring electrode 16 is formed within the trench 14, so that the P-type gate layer 15 of the cell region 2 and a gate electrode formed in the substrate front surface in a region different from the cell region are connected by the gate wiring electrode 16. On the other hand, in the ninth example, the P-type layer 62 and the contact layer 63 are formed in the gate contact region 9, so that the P-type gate layer 15 of the cell region 2 and the gate electrode 64 formed in the substrate front surface in the gate contact region 9 are connected by the P-type gate layer 15 and the P-type layer 62. When the gate wiring electrode 16 and the P-type gate layer 15 are compared, the gate wiring electrode 16 made of the metal is lower in an electric resistance than the P-type gate layer 15 made of the impurity semiconductor layer.

Accordingly, the first example is more favorable than the ninth example from the viewpoint of lowering the gate wiring resistance.

Incidentally, the individual examples described above may well be combined within a possible range.

Second Embodiment

First Example

Figure 16:
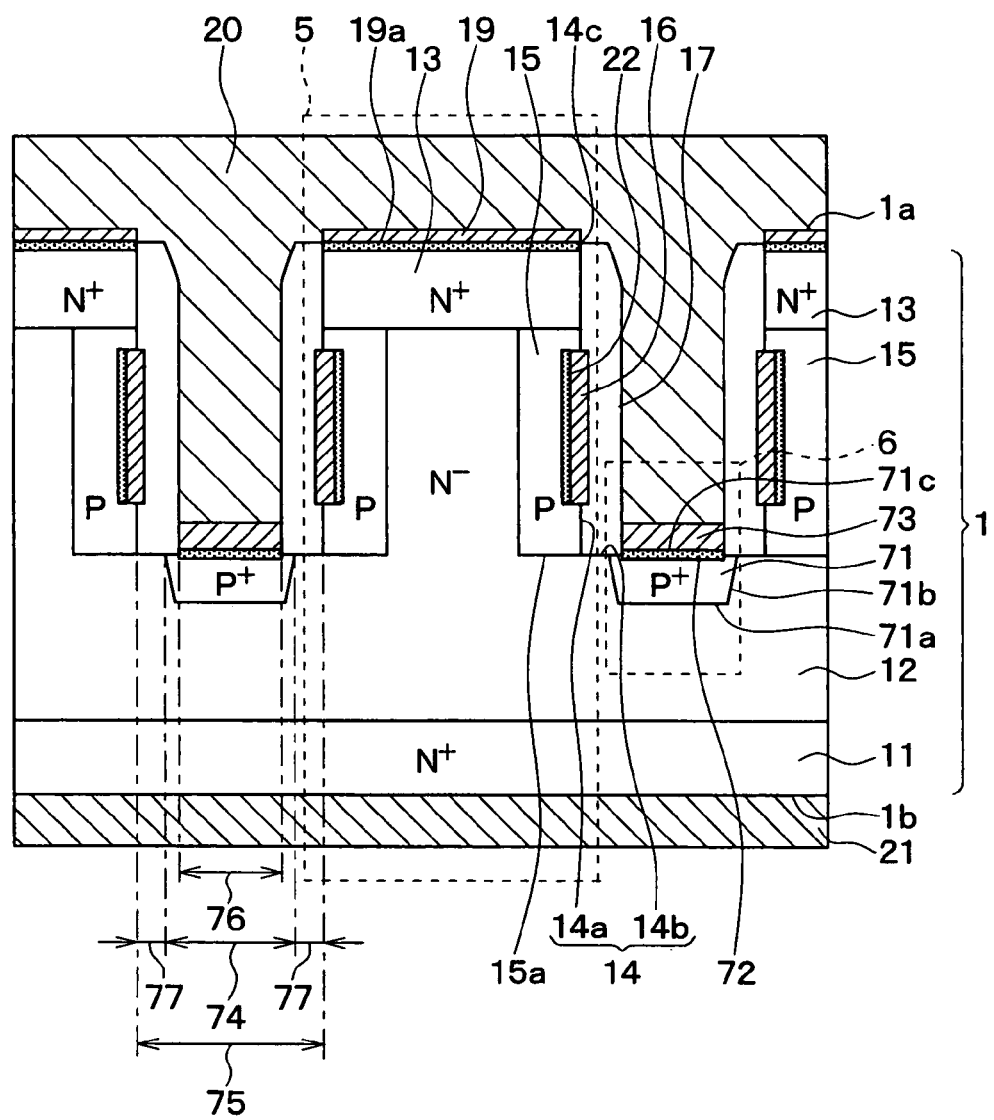
FIG. 16 is a cross sectional view showing a SiC semiconductor device according to a first example of a second embodiment.

FIG. 16 shows a sectional view of a semiconductor device which is similar to the first example of this embodiment.

A structure shown in FIG. 16 differs from the structure shown in FIG. 2 as described in the first embodiment, in the point that the Schottky electrode 18 is replaced with a P$^+$-type layer 71 defining a P-N junction with the N$^-$-type drift layer 12, and the other constituent portions are the same as in the structure shown in FIG. 2. Accordingly, the point different from the structure shown in FIG. 2 will be chiefly described below.

The P$^+$-type layer 71 is formed in a trench region in a plan layout, and more concretely, it lies directly under a trench bottom surface 14b and faces to this trench bottom surface 14b. Besides, since the bottom surface 71a of the P$^+$-type layer 71 is located below the bottom surface 15a of a P-type gate layer 15, the bottom surface 71a and side surface 71b of the P$^+$-type layer 71 are connected with the N$^-$-type drift layer 12, and a P-N junction diode 6 is constituted by the P$^+$-type layer 71 and the N$^-$-type drift layer 12. This P$^+$-type layer 71 may provide a diode constituent portion.

Besides, the P$^+$-type layer 71 is electrically connected with a source electrode wiring line 20 buried in a trench 14, through a contact layer 72 and an ohmic electrode 73. In this manner, in the structure shown in FIG. 16, the P$^+$-type layer 71 is connected with the source electrode wiring line 20 at the trench bottom surface 14b in the cell region 2. According to the structure shown in FIG. 16, accordingly, the wiring resistance of the P$^+$-type layer 71 of the P-N junction diode 6 can be made lower than in a case where the P$^+$-type layer 71 is connected with a source electrode 19 in a region different from the cell region.

Besides, the width 74 of the P-type layer 71 is smaller than the width 75 of the trench 14, the P$^+$-type layer 71 does not protrude beyond the trench bottom surface 14b in a lateral direction in the figure, and the P$^+$-type layer 71 is spaced from the P-type gate layer 15.

Besides, the width 74 of the P$^+$-type layer 71 is greater than the interval 76 between interlayer insulator films 17 opposing within the trench 14, namely, the interval 76 in the lateral direction in the figure, the contact layer 72 being the connection part between the P$^+$-type layer 71 and the source wiring electrode 20 is located inside the outer peripheral end of the P$^+$-type layer 71 at the upper surface 71c thereof, and the contact layer 72 does not protrude beyond the upper surface 71c of the P$^+$-type layer 71 in the lateral direction in the figure. Here, in a case where the contact layer 72 protrudes beyond the upper surface 71c of the P$^+$-type layer 71, the Schottky connection part between the drift layer 12 and the source wiring electrode 20 is formed, and the withstand voltage of the P-N junction diode 6 lowers. Therefore, the contact layer 72 is prevented from protruding beyond the upper surface 71c of the P$^+$-type layer 71, as shown in FIG. 16, whereby the withstand voltage of the P-N junction diode 6 can be heightened.

Besides, the intervals 77 between the P$^+$-type layer 71 and the P-type gate layers 15 located on both the left and right sides thereof are the same.

As thus far described, the semiconductor device of this embodiment has the structure in which the Schottky electrode 18 in the first embodiment is replaced with the P$^+$-type layer 71. Basically, therefore, it has the same advantages as those of the first embodiment.

Next, a method for manufacturing the semiconductor device of the above structure will be described. FIGS. 17A to 17F show a manufacturing process for the semiconductor device of the above structure. Steps shown in FIGS. 17A to 17F are successively performed after the steps shown in FIGS. 4A to 4D.

More specifically, after the P-type gate layers 15 have been formed on the trench side surfaces 14a as shown in FIG. 4D, an oxide film of TEOS (tetraethoxysilane) or the like is formed on the trench inner walls 14a and 14b and is thereafter etched back to remove the oxide film located on the trench bottom surfaces 14b, whereby the oxide films 81 are formed on only the trench side surfaces 14a in the trench inner walls 14a and 14b. As a result, the surfaces of the P-type gate layers 15 are covered with the oxide films 81, and the $N^-$-type drift layer 12 is exposed at the trench bottom surfaces 14b.

Incidentally, at the time when the oxide film is formed, the thickness of the oxide film is set so that the interval 81a between the oxide films 81 opposing in each trench 14 may become the size of each ion implantation region for forming a $P^+$-type layer 71. Besides, owing to the thickness of the oxide film 81, the interval between the P-type gate layer 15 and the $P^+$-type layer 71 which is to be formed at the next step is determined.

Figure 17A:
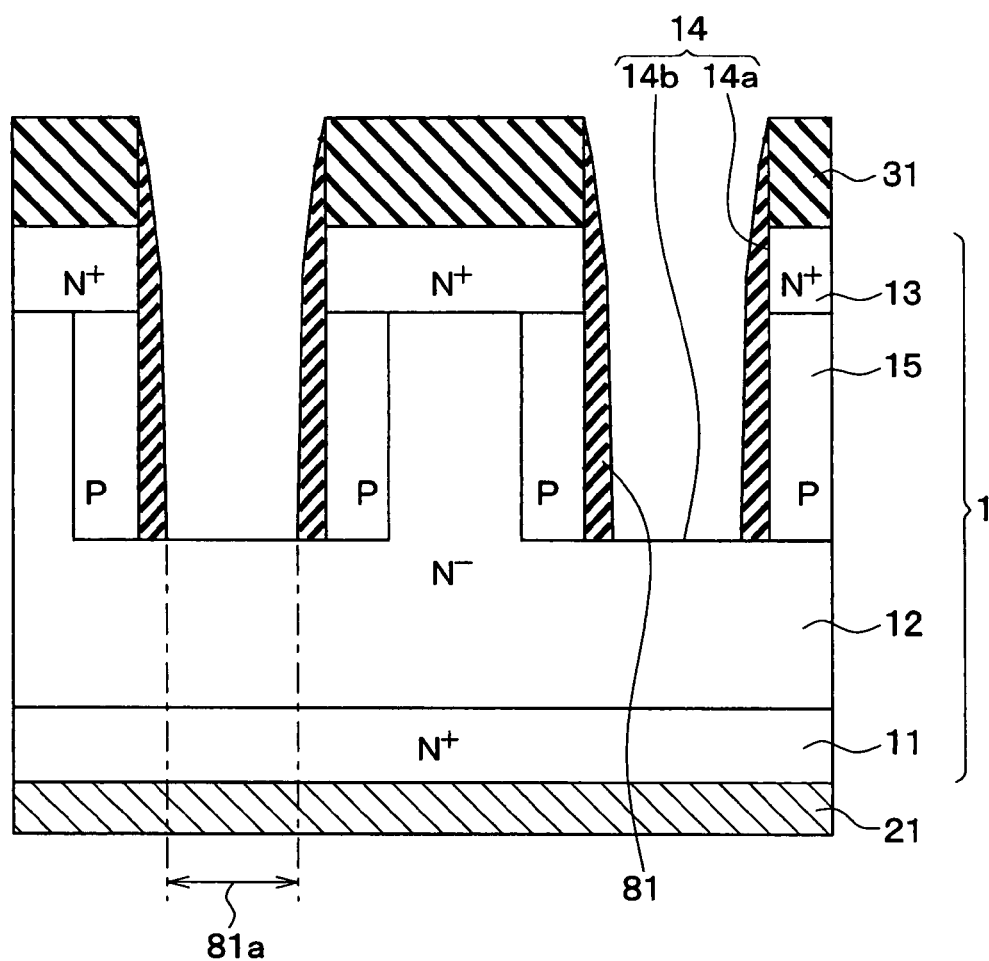
FIGS. 17A to 17F are cross sectional views explaining a method for manufacturing the device in FIG. 16.
Figure 17B:
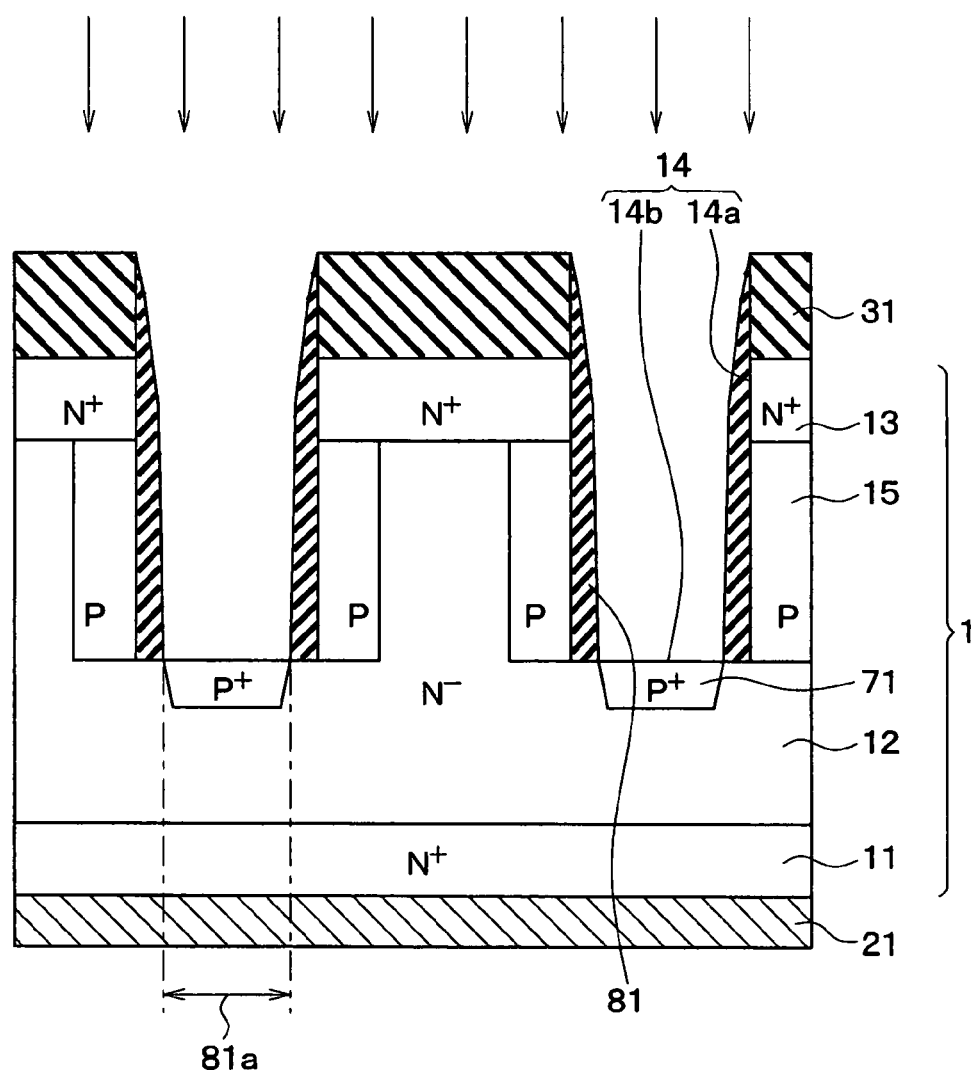

Subsequently, as shown in FIG. 17B, the $P^+$-type layers 71 are formed in such a way that, using the oxide films 81 as a mask, the trench bottom surfaces 14b which are not covered with the oxide films 81 are subjected to the ion implantation which employs P-type impurity ions of, for example, Al (aluminum) or B (boron).

Figure 17C:
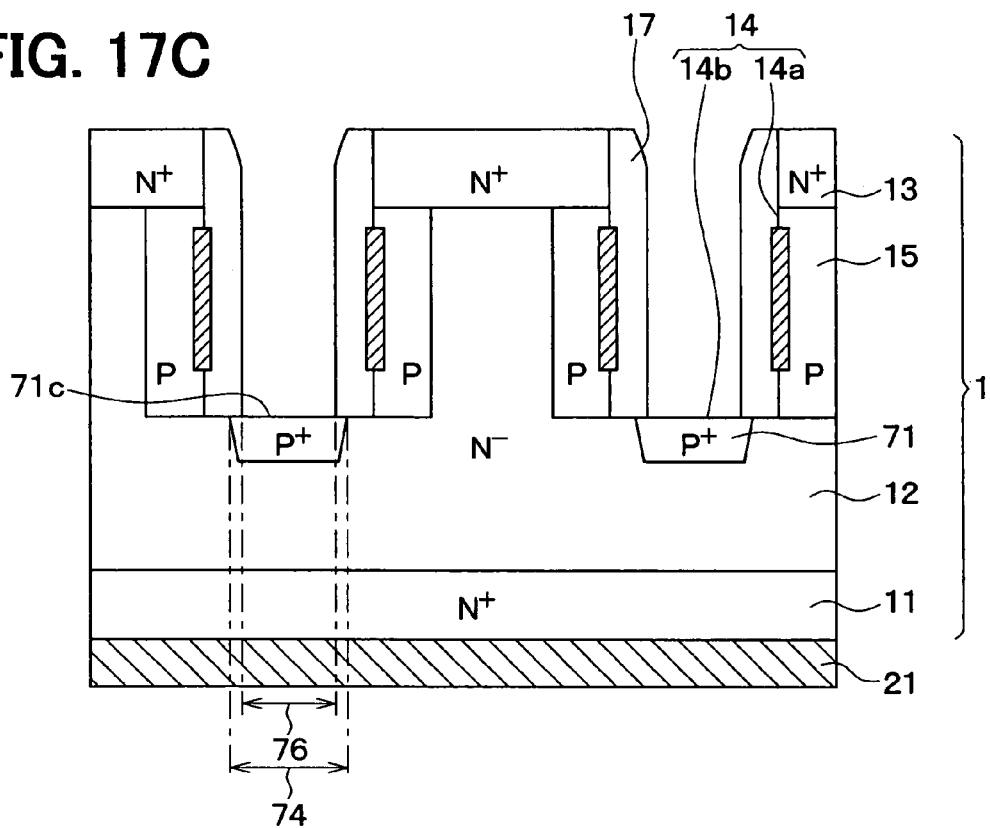

Subsequently, as shown in FIGS. 4E to 4L, the gate wiring electrodes 16 and the contact layers 22 are formed. However, at the time when the interlayer insulator films 17 are formed on the trench side surfaces 14a, the thickness of each interlayer insulator film 17 is set so that, as shown in FIG. 17C, the interval 76 between the interlayer insulator films 17 opposing within the trench 14 may become smaller than the width 74 of the $P^+$-type layer 71, in other words, that a region inside the outer peripheral end of the $P^+$-type layer 71 in the upper surface 71c of this $P^+$-type layer 71 may be exposed.

The reason why, in this manner, the $P^+$-type layer 71 and the interlayer insulator films 17 are overlapped in a positional relationship in a lateral direction in the figure, is that each contact layer 72 is to be formed in the region inside the outer peripheral end, in the upper surface 71c of the $P^+$-type layer 71, at the next step.

Figure 17D:
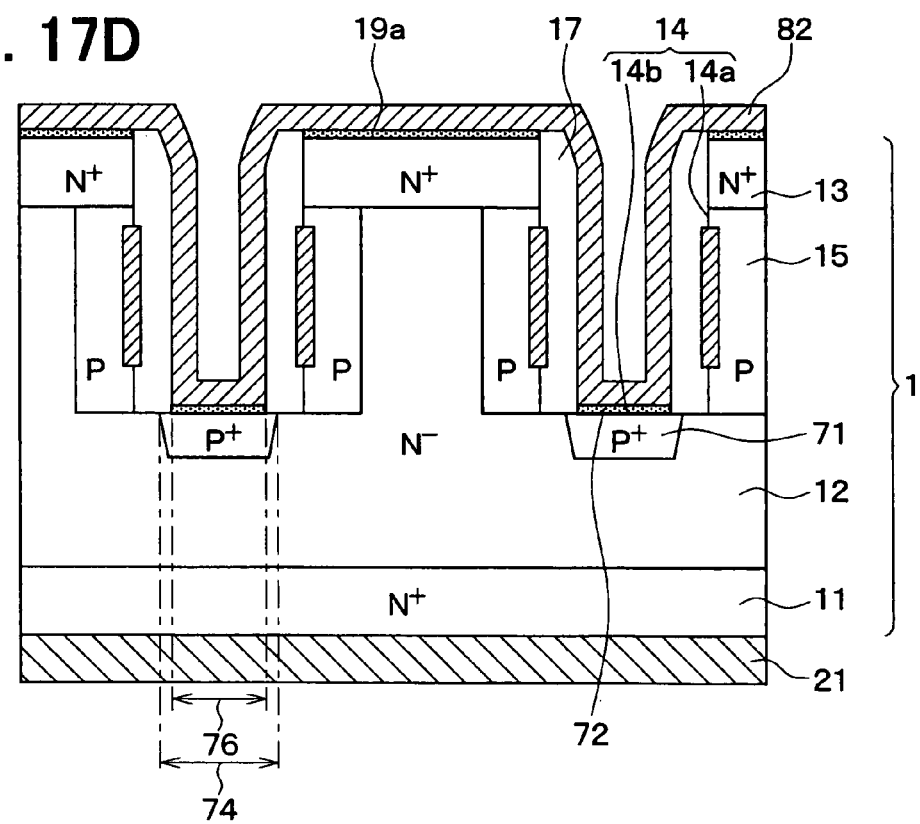

Subsequently, as shown in FIG. 17D, a metal film 82 for electrodes is formed extending on the front surfaces of the $N^+$-type source layers 13 and on the front surfaces of the $P^+$-type layers 71. Thereafter, a heat treatment is performed, whereby silicide layers to become the contact layers 19a are formed between the $N^+$-type source layers 13 and the metal film 82, and silicide layers to serve as the contact layers 72 are formed between the $P^+$-type layers 71 and the metal film 82.

Figure 17E:
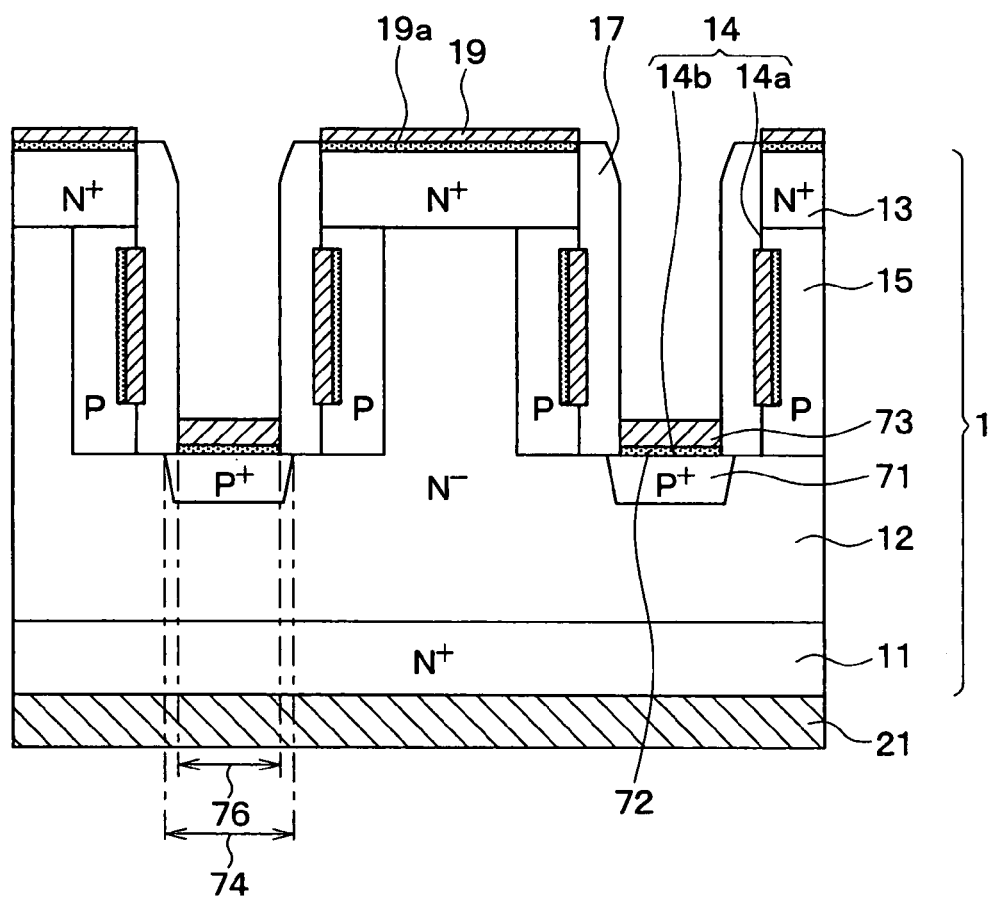

Subsequently, as shown in FIG. 17E, the metal film 82 is etched, thereby to remove those parts of the metal film 82 which are not formed with the silicide layers. That is, in the metal film 82, the parts on the front surfaces of the $N^+$-type source layers 13 and the parts on the front surfaces of the $P^+$-type layers 71 are left behind, and the other parts are removed. Thus, the source electrodes 19 and the ohmic electrodes 73 are formed.

Figure 17F:
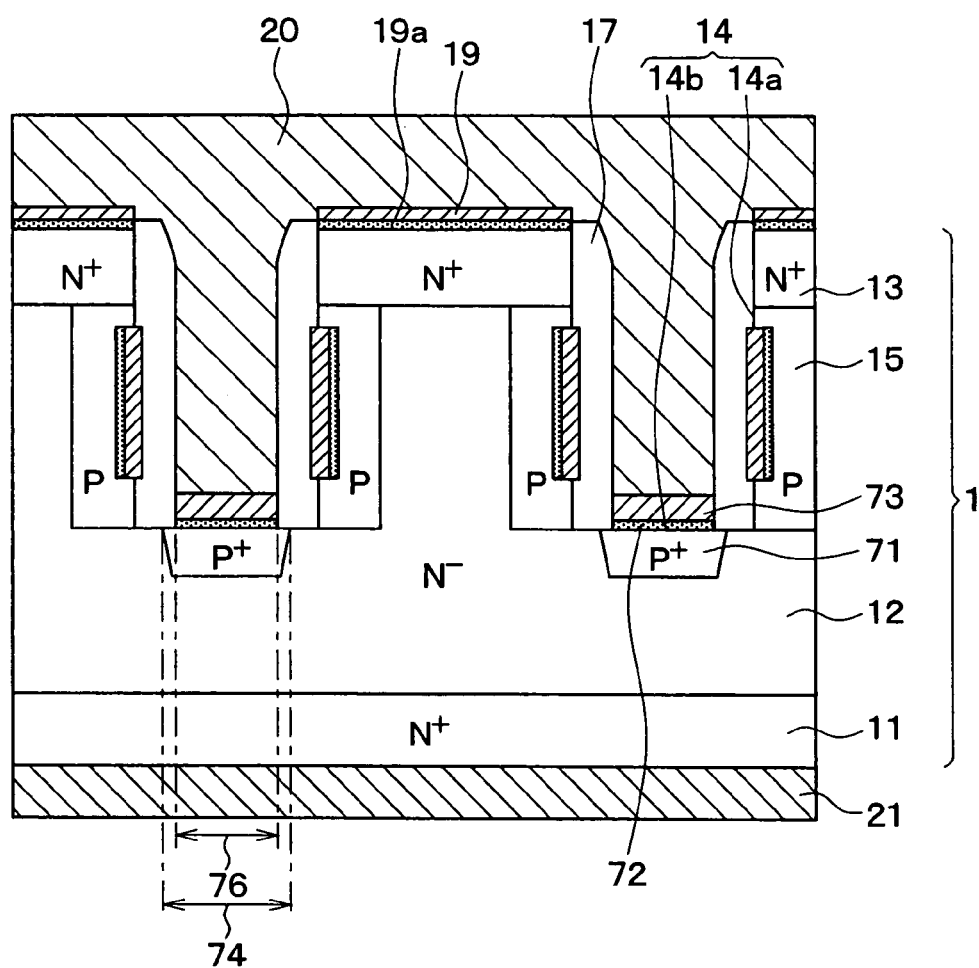

Subsequently, as shown in FIG. 17F, the source wiring electrode 20 is formed extending along the front surface of the semiconductor substrate 1 from the inner parts of the trenches 14. Then, the semiconductor device shown in FIG. 6 is manufactured.

In this embodiment, the oxide films 81 serving as mask members are simultaneously formed on the whole areas of the trench inner walls 14a and 14b, at the step shown in FIG. 17A. Therefore, the thicknesses of the oxide films 81 in a direction perpendicular to the trench side surfaces 14a can be made uniform. Thus, the $P^+$-type layers 71 can be formed in self-alignment with the trench side surfaces 14a, at the step shown in FIG. 17B, and the distances between the $P^+$-type layers 71 and the trench side surfaces 14a located on both the sides in the figure can be equalized.

Modifications to the structure shown in FIG. 16 will be described below.

Second Example

Figure 18:
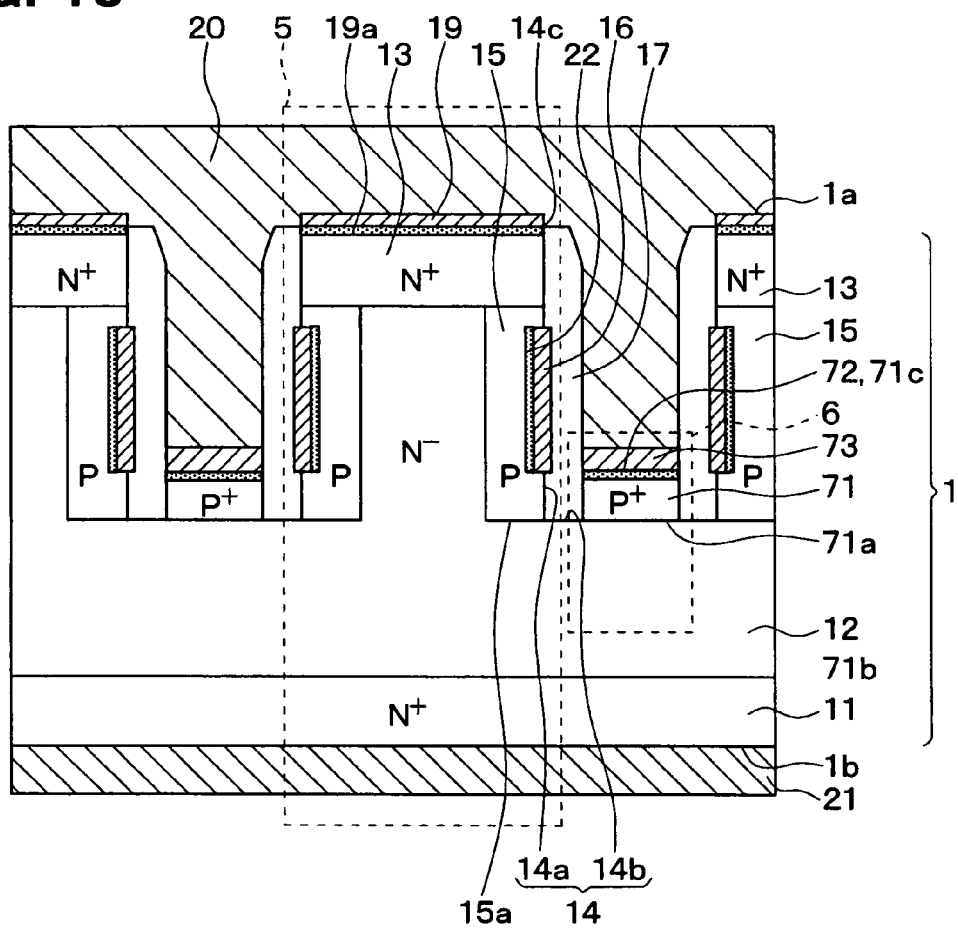
FIG. 18 is a cross sectional view showing a SiC semiconductor device according to a second example of the second embodiment.

FIG. 18 shows a sectional view of a semiconductor device which is the second example of this embodiment. Incidentally, constituent portions similar to those in FIG. 16 are assigned the same numerals and signs as in FIG. 16.

As shown in FIG. 18, $P^+$-type layers 71 are formed within the trenches 14. Each of the $P^+$-type layers 71 is located on the side of the lower half of the corresponding trench 14, and the lower end part 71a of the $P^+$-type layer 71 is at the same position as that of the trench bottom surface 14b, while the upper end part 71c of the $P^+$-type layer 71 is located above the trench bottom surface 14b. The semiconductor device of this structure can be manufactured, for example, in such a way that, at the step shown in FIG. 6E, the $P^+$-type layers 71 are formed by epitaxial growth, instead of the formation of the Schottky electrodes 18.

Third Example

Figure 19:
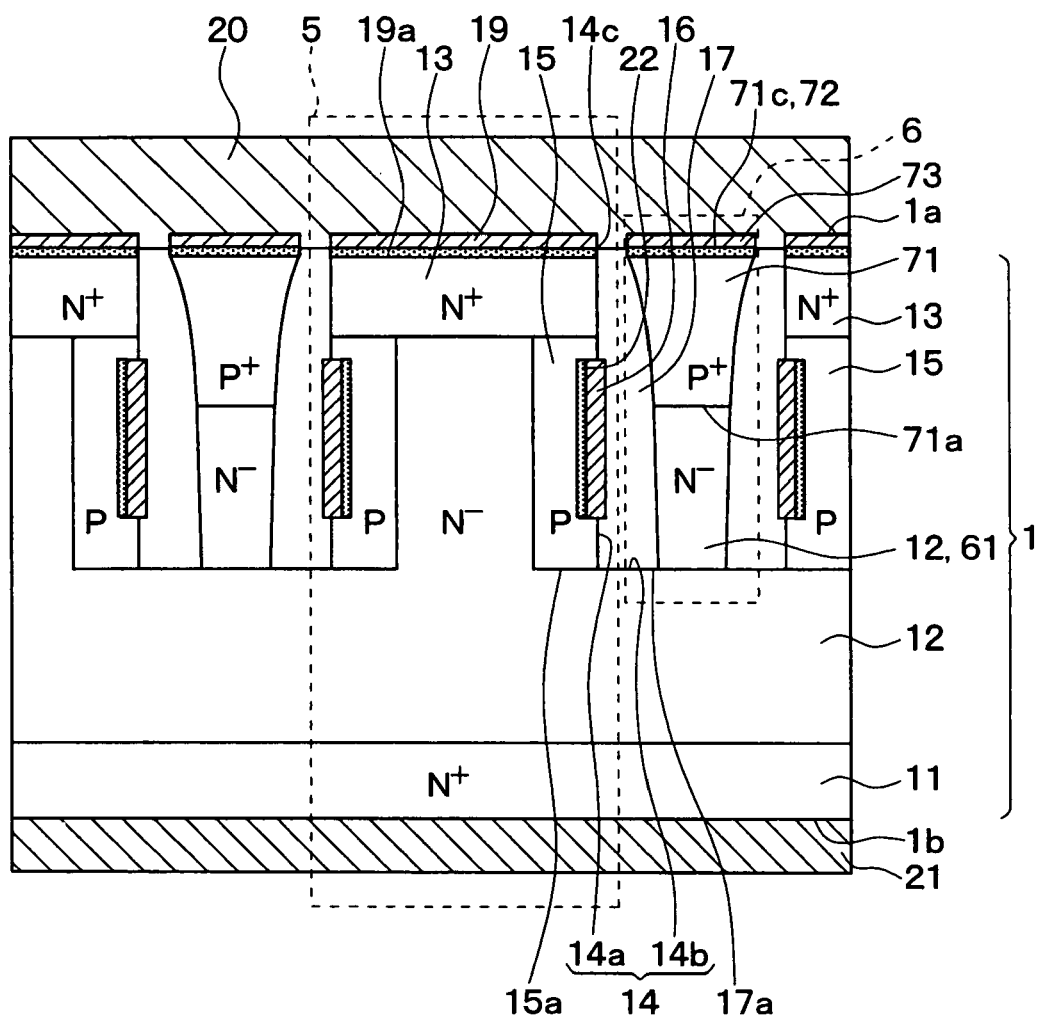
FIG. 19 is a cross sectional view showing a SiC semiconductor device according to a third example of the second embodiment.

FIG. 19 shows a sectional view of a semiconductor device which is the third example of this embodiment.

The structure shown in FIG. 19 is a structure in which the Schottky electrodes 18 are altered into $P^+$-type layers 71, with respect to the structure shown in FIG. 7 as has been described in the third example of the first embodiment. More specifically, each of the $P^+$-type layers 71 is located within the corresponding trench 14 and on the side of the upper half of the trench 14, and the lower end part 71a of the $P^+$-type layer 71 is located above the trench bottom surface 14b, while the upper end part 71c of the $P^+$-type layer 71 is located at the upper part of the trench 14. In addition, the $N^-$-type drift layer 12 is located at the lower half of the trench 14.

The semiconductor device of this structure can be manufactured in such a way that, after the step shown in FIG. 6D, each $N^-$-type layer 61 is formed at the inner part of the corresponding trench 14 by epitaxial growth or the like, followed by forming the $P^+$-type layer 71 on the $N^-$-type layer 61.

Fourth Example

Figure 20:
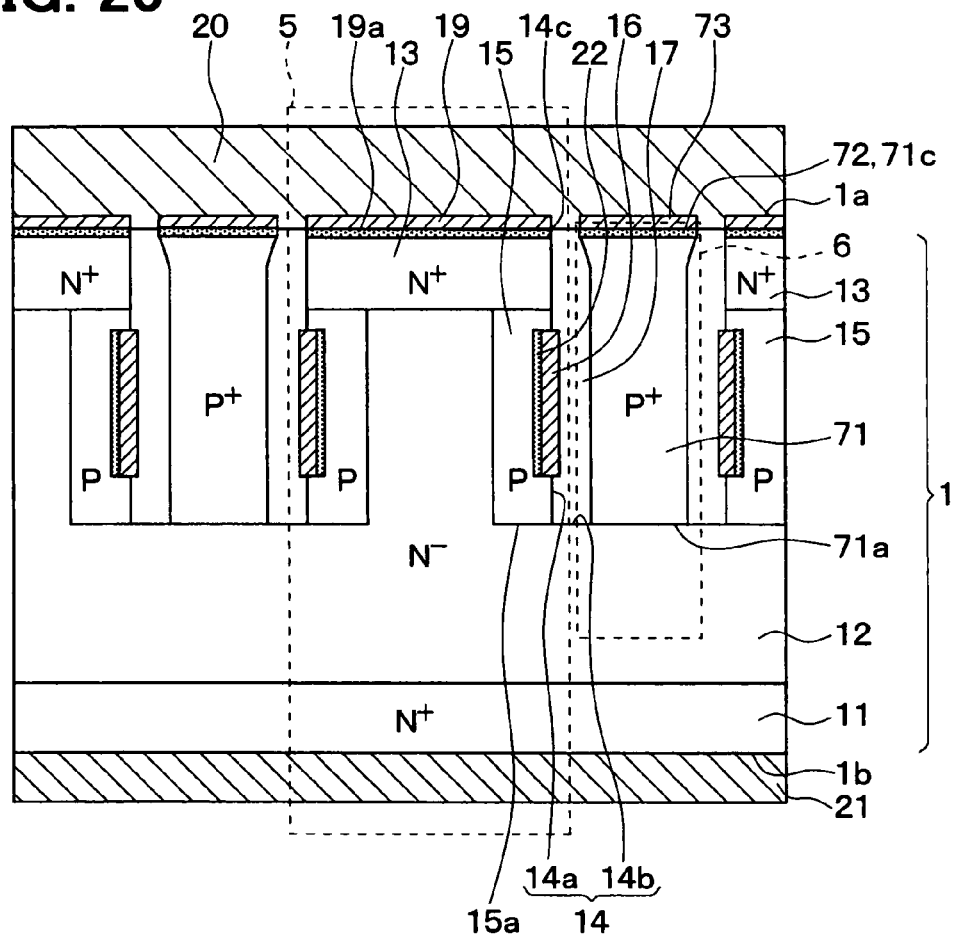
FIG. 20 is a cross sectional view showing a SiC semiconductor device according to a fourth example of the second embodiment.

FIG. 20 shows a sectional view of a semiconductor device which is the fourth example of this embodiment.

As shown in FIG. 20, each of $P^+$-type layers 71 is formed at the whole inner part of the corresponding trench 14, and the lower end part 71a of the $P^+$-type layer 71 is at the same position as that of the trench bottom surface 14b, while the upper end part 71c of the $P^+$-type layer 71 is located at the upper part of the trench 14.

The semiconductor device of this structure can be manufactured in such a way that, after the step shown in FIG. 6D, the $P^+$-type layers 71 are formed within the trenches 14 by epitaxial growth or the like. By the way, in this case, a film of excellent heat resistance enduring an epitaxial temperature is employed as each interlayer insulator film 17.

Other Embodiments

In each of the foregoing embodiments, there has been described the case where the drain layer 11, drift layer 12 and source layer 13 are of the N-type, and where the gate layer 15 is of the P-type. However, all the conductivity types may be opposite in a silicon carbide semiconductor device.

Besides, in each of the foregoing embodiments, the silicon carbide semiconductor device has been described by mentioning the J-FET of the normally-OFF type as the example. However, the device may be the J-FET of the normally-ON type.

The above disclosure has the following aspects.

According to a first aspect of the present disclosure, a SiC semiconductor device includes: a SiC substrate including a drain layer having a first conductive type, a drift layer having the first conductive type and a source layer having the first conductive type, wherein the drain layer, the drift layer and the source layer are stacked in this order; a plurality of trenches, each of which penetrates the source layer and reaches the drift layer; a gate layer having a second conductive type and disposed on a sidewall of each trench, wherein a part of the drift layer sandwiched between the gate layer on the sidewalls of adjacent two trenches provides a channel region; an insulation film disposed on the sidewall of each trench for covering the gate layer; a source electrode disposed on the source layer; and a diode portion disposed in each trench and/or under each trench and contacting the drift layer to provide a diode. The diode portion is electrically coupled with the source electrode, and electrically insulated from the gate layer with the insulation film on the sidewall of each trench.

In the above device, a diode is formed in a transistor forming region.

Alternatively, the diode portion may have a bottom, which is deeper than a bottom of the gate layer. In this case, electric field concentration at the corner of the gate layer is reduced when a voltage is applied to the drain. Alternatively, the diode portion may have a bottom, which is deeper than a bottom of the insulation film. In this case, a connection area becomes large so that a diode resistance is reduced. Alternatively, a distance between the diode portion and the gate layer may be homogeneous in each trench. In this case, a cell size is reduced.

Alternatively, the drain layer, the drift layer, the gate layer and the source layer may provide a transistor so that a cell region is provided among the plurality of trenches, and the diode portion is electrically coupled with the source electrode in the cell region. Further, the device may further include a source wiring electrode disposed in the trench and on the source electrode so that the diode portion is electrically coupled with the source electrode through the source wiring electrode. The source wiring electrode and the diode portion have a connection portion therebetween, and the connection portion is disposed in the trench. Thus, diode characteristics are appropriately controlled. Furthermore, the connection portion between the source wiring electrode and the diode portion may be shallower than a bottom of the trench. In this case, the source wiring electrode directly contacts the drift layer so that a connection is formed therebetween. Further, the source wiring electrode in the trench may have a width parallel to a surface of the SiC substrate, and the width of the source wiring electrode may become larger as it goes toward the surface of the SiC substrate.

Alternatively, the diode portion may include a Schottky electrode made of metal, and the Schottky electrode and the drift layer provide a Schottky junction so that the diode portion provides a Schottky diode. Further, the Schottky electrode may have a width parallel to a surface of the SiC substrate. The width of the Schottky electrode is homogeneous in the trench. The source electrode and the Schottky electrode have a connection portion therebetween. The connection portion is disposed in the trench and has a width parallel to the surface of the SiC substrate, and the width of the connection portion is substantially equal to the width of the Schottky electrode.

Alternatively, the diode portion may include a second conductive type semiconductor layer, and the second conductive type semiconductor layer and the drift layer provide a PN junction therebetween so that the diode portion provides a PN junction diode. Further, the device may further include a source wiring electrode disposed in the trench and on the source electrode so that the diode portion is electrically coupled with the source electrode through the source wiring electrode. The second conductive type semiconductor layer is disposed just under a bottom of the trench. The source wiring electrode and the second conductive type semiconductor layer have a connection portion therebetween. The connection portion between the source wiring electrode and the second conductive type semiconductor layer has a width parallel to the surface of the SiC substrate. The second conductive type semiconductor layer has a top facing the source wiring electrode, and the top of the second conductive type semiconductor layer has a width parallel to the surface of the SiC substrate, the width of the top of the second conductive type semiconductor layer being larger than the width of the connection portion.

Alternatively, the gate layer may be only disposed on the sidewall of the trench. Further, the device may further include a gate electrode disposed on the sidewall of the trench. The gate electrode is electrically coupled with the gate layer. Furthermore, the gate layer and the gate electrode may have a connection portion therebetween, and the connection portion between the gate layer and the gate electrode is inside of the gate layer.

According to a second aspect of the present disclosure, a method for manufacturing a SiC semiconductor device includes: preparing a SiC substrate, which includes a drain layer having a first conductive type, a drift layer having the first conductive type and a source layer having the first conductive type, wherein the drain layer, the drift layer and the source layer are stacked in this order; forming a plurality of trenches, each of which penetrates the source layer and reaches the drift layer; forming a gate layer having a second conductive type and disposed on a sidewall of each trench, wherein a part of the drift layer sandwiched between the gate layer on the sidewalls of adjacent two trenches provides a channel region, and wherein the drift layer is exposed on a bottom of each trench; forming a source electrode on the source layer; forming an insulation film on the sidewall of each trench for covering the gate layer; and forming a Schottky electrode in each trench or under each trench. The Schottky electrode is electrically coupled with the source electrode, and electrically insulated from the gate layer with the insulation film on the sidewall of each trench, and the Schottky electrode and the drift layer provide a Schottky junction to form a Schottky diode.

In the above method, a diode is formed in a transistor forming region. Further, the insulation film on the sidewall of the trench becomes homogeneous. Thus, the Schottky electrode is formed with a self-alignment manner with respect to the sidewall of the trench. Thus, the distance between the Schottky electrode and the sidewall of the trench is homogeneous.

Alternatively, the forming the insulation film may include: depositing the insulation film on the sidewall and a bottom of the trench; and removing a part of the insulation film on the bottom of the trench so that the drift layer is exposed on the bottom of the trench. The forming the Schottky electrode may include embedding a metallic member in the trench or under the trench so that the metallic member provides the Schottky electrode. Further, the forming the plurality of trenches may include: forming a plurality of first trenches, each of which penetrates the source layer and reaches the drift layer; and forming a plurality of second trenches after the forming the gate layer and before the forming the Schottky electrode. Each first trench has a width parallel to a surface of the SiC substrate, and each second trench has a width parallel to the surface of the SiC substrate. The width of the second trench is smaller than the width of the first trench. In the forming the insulation film, a bottom of the insulation film is shallower than a bottom of the first trench, and in the forming the Schottky electrode, the Schottky electrode is formed in the second trench or under the second trench. Furthermore, the forming the plurality of second trenches may include: forming a mask on a sidewall and the bottom of the first trench; removing a part of the mask on the bottom of the first trench so that the drift layer is exposed on the bottom of the first trench; and etching a part of the drift layer exposed on the bottom of the first trench.

Alternatively, the forming the gate layer may include: implanting an ion on the sidewall and the bottom of the trench so that a second conductive type film is formed on the sidewall and the bottom of the trench; and removing a part of the second conductive type film on the bottom of the trench so that the gate layer provided by the second conductive type film is formed on the sidewall of the trench.

According to a third aspect of the present disclosure, a method for manufacturing a SiC semiconductor device includes: preparing a SiC substrate, which includes a drain layer having a first conductive type, a drift layer having the first conductive type and a source layer having the first conductive type, wherein the drain layer, the drift layer and the source layer are stacked in this order; forming a plurality of trenches, each of which penetrates the source layer and reaches the drift layer; forming a gate layer having a second conductive type and disposed on a sidewall of each trench, wherein a part of the drift layer sandwiched between the gate layer on the sidewalls of adjacent two trenches provides a channel region, and wherein the drift layer is exposed on a bottom of the trench; forming a second conductive type semiconductor layer just under the bottom of the trench by implanting an ion on the bottom of the trench after the forming the gate layer, wherein the second conductive type semiconductor layer is separated from the gate layer, and wherein the second conductive type semiconductor layer and the drift layer provide a PN junction; forming an insulation film disposed on the sidewall of each trench for covering the gate layer after the forming the second conductive type semiconductor layer; forming a source electrode disposed on the source layer after the forming the insulation film; and forming a source wiring electrode in the trench after the forming the source electrode, wherein the source electrode is electrically coupled with the second conductive type semiconductor layer through the source wiring electrode.

In the above method, a diode is formed in a transistor forming region.

Alternatively, the method may further include: forming a mask on a sidewall and the bottom of each trench after the forming the gate layer and before the forming the second conductive type semiconductor layer; and removing the mask on the bottom of the trench so that the drift layer is exposed on the bottom of the trench. The forming the second conductive type semiconductor layer includes implanting an ion on the bottom of the trench after the removing the mask.

Alternatively, the second conductive type semiconductor layer may have a first width parallel to a surface of the SiC substrate. After the forming the insulation film, a part of the second conductive type semiconductor layer is exposed on the bottom of the trench. The part of the second conductive type semiconductor layer has a second width parallel to the surface of the SiC substrate. The second width of the part of the second conductive type semiconductor layer is smaller than the first width of the second conductive type semiconductor layer, and in the forming the source wiring electrode, the source wiring electrode is electrically coupled with the part of the second conductive type semiconductor layer. Further, the method may further include: forming a silicide layer on the part of the second conductive type semiconductor layer after the forming the insulation film and before the forming the source wiring electrode.

Alternatively, the forming the gate layer may include: implanting an ion on the sidewall and the bottom of the trench so that a second conductive type film is formed on the sidewall and the bottom of the trench; and removing a part of the second conductive type film on the bottom of the trench so that the gate layer provided by the second conductive type film is formed on the sidewall of the trench.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. A SiC semiconductor device comprising:
a SiC substrate including a drain layer having a first conductive type, a drift layer having the first conductive type and a source layer having the first conductive type, wherein the drain layer, the drift layer and the source layer are stacked in this order;
a plurality of trenches, each of which penetrates the source layer and reaches the drift layer;
a gate layer having a second conductive type and disposed on a sidewall of each trench, wherein a part of the drift layer sandwiched between the gate layer on the sidewalls of adjacent two trenches provides a channel region;
an insulation film disposed on the sidewall of each trench for covering the gate layer;
a source electrode disposed on the source layer; and
a diode portion disposed in each trench and/or under each trench and contacting the drift layer to provide a diode, wherein
the diode portion is electrically coupled with the source electrode, and electrically insulated from the gate layer with the insulation film on the sidewall of each trench;
the diode portion includes a Schottky electrode made of metal, and the Schottky electrode and the drift layer provide a Schottky junction so that the diode portion provides a Schottky diode.

2. The device according to claim 1, wherein the diode portion has a bottom, which is deeper than a bottom of the gate layer.

3. The device according to claim 1, wherein the diode portion has a bottom, which is deeper than a bottom of the insulation film.

4. The device according to claim 1, wherein a distance between the diode portion and the gate layer is homogeneous in each trench.

5. The device according to claim 1, wherein the drain layer, the drift layer, the gate layer and the source layer provide a transistor so that a cell region of the transistor is provided among the plurality of trenches, and the diode portion is electrically coupled with the source electrode in the cell region.

6. The device according to claim 5, further comprising: a source wiring electrode disposed in the trench and on the source electrode so that the diode portion is electrically coupled with the source electrode through the source wiring electrode, wherein the source wiring electrode and the diode portion have a connection portion therebetween, and the connection portion is disposed in the trench.

7. The device according to claim 6, wherein the connection portion between the source wiring electrode and the diode portion is shallower than a bottom of the trench.

8. The device according to claim 6, wherein the source wiring electrode in the trench has a width parallel to a surface of the SiC substrate, and the width of the source wiring electrode becomes larger as it goes toward the surface of the SiC substrate.

9. The device according to claim 1, wherein the Schottky electrode has a width parallel to a surface of the SiC substrate, the width of the Schottky electrode is homogeneous in the trench, the source electrode and the Schottky electrode have a connection portion therebetween, the connection portion is disposed in the trench and has a width parallel to the surface of the SiC substrate, and the width of the connection portion is substantially equal to the width of the Schottky electrode.

10. The device according to claim 1, wherein the diode portion includes a second conductive type semiconductor layer, and the second conductive type semiconductor layer and the drift layer provide a PN junction therebetween so that the diode portion provides a PN junction diode.

11. The device according to claim 10, further comprising: a source wiring electrode disposed in the trench and on the source electrode so that the diode portion is electrically coupled with the source electrode through the source wiring electrode, wherein the second conductive type semiconductor layer is disposed just under a bottom of the trench, the source wiring electrode and the second conductive type semiconductor layer have a connection portion therebetween, the connection portion between the source wiring electrode and the second conductive type semiconductor layer has a width parallel to the surface of the SiC substrate, the second conductive type semiconductor layer has a top facing the source wiring electrode, and the top of the second conductive type semiconductor layer has a width parallel to the surface of the SiC substrate, the width of the top of the second conductive type semiconductor layer being larger than the width of the connection portion.

12. The device according to claim 1, wherein the gate layer is only disposed on the sidewall of the trench.

13. The device according to claim 12, further comprising: a gate electrode disposed on the sidewall of the trench, wherein the gate electrode is electrically coupled with the gate layer.

14. The device according to claim 13, wherein the gate layer and the gate electrode have a connection portion therebetween, and the connection portion between the gate layer and the gate electrode is inside of the gate layer.

* * * * *